(12) United States Patent  (10) Patent No.: US 8,500,467 B2
Ni et al.  (45) Date of Patent: Aug. 6, 2013

(54) FLASH DRIVE WITH SWIVEL COVER

(75) Inventors: Jim Chin-Nan Ni, San Jose, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 188 days.

(21) Appl. No.: 13/157,260

(22) Filed: Jun. 9, 2011

(65) Prior Publication Data

US 2011/0237099 A1   Sep. 29, 2011

Related U.S. Application Data

(63) Continuation-in-part of application No. 11/929,857, filed on Oct. 30, 2007, now Pat. No. 8,095,971.

(51) Int. Cl.
*H01R 13/44* (2006.01)

(52) U.S. Cl.
USPC ........................................ 439/142; 439/136

(58) Field of Classification Search
USPC ................................................. 439/142, 136
See application file for complete search history.

(56) References Cited

U.S. PATENT DOCUMENTS

| | | | |
|---|---|---|---|
| 6,125,192 A | 9/2000 | Bjorn et al. | |
| 6,926,544 B2 * | 8/2005 | Lee | 439/147 |
| 6,932,629 B2 * | 8/2005 | Ikenoue | 439/138 |
| 7,407,393 B2 | 8/2008 | Ni et al. | |
| 7,420,803 B2 | 9/2008 | Hsueh et al. | |
| 7,440,286 B2 * | 10/2008 | Hiew et al. | 361/737 |
| 7,473,112 B2 * | 1/2009 | Zhu et al. | 439/142 |
| 7,500,858 B2 * | 3/2009 | Emerson et al. | 439/136 |
| 7,544,073 B2 * | 6/2009 | Nguyen et al. | 439/135 |
| 7,699,630 B2 * | 4/2010 | Kim | 439/136 |
| 7,740,493 B2 * | 6/2010 | Ni et al. | 439/131 |
| 8,095,971 B2 * | 1/2012 | Nguyen et al. | 726/9 |
| 8,246,362 B2 * | 8/2012 | Ma | 439/131 |
| 2008/0019090 A1 | 1/2008 | Zhu et al. | |
| 2008/0278902 A1 * | 11/2008 | Nguyen et al. | 361/684 |

* cited by examiner

*Primary Examiner* — Hae Moon Hyeon

(74) *Attorney, Agent, or Firm* — Bever, Hoffman & Harms, LLP; Patrick T. Bever

(57) ABSTRACT

A swivel-type portable flash device includes a C-shaped swivel cover that rotates (swivels) relative to a housing between an open position in which a plug connector is exposed for insertion in a host system, and a closed position in which the plug connector is covered and protected by the swivel cover. The swivel cover is permanently rotatably connected to the housing by ring-shaped protrusions that are movably engaged inside corresponding recessed ring-shaped grooves formed in upper/lower walls of the housing, whereby the swivel cover is manually rotatable relative to the housing between the opened and closed positions. The swivel cover includes locking structures (e.g., locking notches) disposed on the ring-shaped protrusions, and the housing includes second locking structures disposed in the recessed ring-shaped grooves, where the first and second locking structures prevent rotation of the swivel cover when the plug connector is closed.

16 Claims, 17 Drawing Sheets

FLASH DRIVE WITH SWIVEL COVER

RELATED APPLICATIONS

This application is a continuation-in-part (CIP) of co-pending U.S. patent application for "Universal Serial Bus (USB) Flash Drive Having Locking Pins and Locking Grooves for Locking Swivel Cap", Ser. No. 11/929,857, filed Oct. 30, 2007.

BACKGROUND OF THE INVENTION

1. Field of the Invention

The present invention relates generally to the field of portable flash drives and particularly to portable drives with swivel caps and methods for manufacturing thereof.

2. Description of the Related Art

Universal serial bus (USB) flash drives represent one type of portable flash devices that are available in various shapes and forms. Conventional pen-type USB flash drives typically include a flash memory device and a controller that are disposed in a protective housing, and are operably connected to a USB plug connector that extends from a front end of the housing. Conventional pen-type USB flash drives typically include a removable cap (cover) that is screwed or otherwise temporarily attached to a front end of the housing over the plug connector when the flash drive was not in use. To expose the USB plug connector for connection to a host device such as a personal computer (PC), a user manually removes the cap and either held the cap or mounted it on the back end of the housing, and then replaces the cap over the plug connector after the desired operation was completed. A problem with these convention pen-type flash devices is that the removable cap can become inadvertently lost while the device is in use, thereby leaving the USB plug connector exposed to damage or contamination.

Based on the above-mentioned industry experience with convention pen-type USB flash drives, it is apparent that next-generation USB flash drives needs a cap/cover that remains attached to the devices housing during operation in order to prevent loss that can result in damage or contamination of the plug connector. In addition, the packaging style and shape of the next-generation USB flash drives needs to be aesthetically pleasing to generate additional interest and enthusiasm for purchasing and using the device over similar devices, and needs a relatively short and compact configuration that is light and may therefore be easily carried around by the user, for example, on a key chain. Perhaps most importantly, the desired next-generation USB flash drive must have minimal manufacturing and assembly costs in order to provide the desired functionality and aesthetic appeal at a low cost to the consumer.

U.S. Pat. No. 6,926,544 describes a conventional swivel-type flash device including a rotary cover that is rotatably attached to the device's case (housing) such that cover can be rotated into a closed position in which the device's USB plug connector is received in an inner space of the cover, or rotated into an open position such that the plug connector is exposed for connection to a host system. The cover is defined by a pair of parallel plate members facing each other with an interval corresponding to the thickness of the case, and the flat parallel plate members have a pair of hinge holes joined to a hinge protuberances that extend from the walls of the case. A locking mechanism, which is provided by a closing part that extends between the parallel plates of the rotary cover and engages a protuberance, is provided to prevent rotation of the cover out of the closed position.

Although the conventional swivel-type flash device of U.S. Pat. No. 6,926,544 addresses the "cap/cover loss" desirable feature of next-generation flash devices in that the rotary cover remains attached to the case during both periods of operation and non-operation, it arguably does not address other desirable features associated with next-generation flash drive devices. First, because the rotary cover is formed by thin, flat parallel plate members and the amount of material surrounding the hinge holes is narrow, the rotary cover is susceptible to breakage at the hinge holes, thereby increasing the chance of undesirable separation of the rotary cover from the case. Second, the hinge protuberances necessarily extend from the outside surfaces of the parallel plate members, making the device somewhat bulky and aesthetically unattractive. Further, the locking mechanism disclosed in U.S. Pat. No. 6,926,544 both increases the material and manufacturing costs of the conventional flash device, and also makes the device undesirably long. That is, the closing part of the rotary cover and the hinge protuberances formed on the case increase both material cost and manufacturing costs (e.g., because the closing part acts as a stiffening flange that resists outward bending of the cover during assembly). Also, in order to align the rotary cover with the case in the fully open position, the length of the rotary cover must be made long enough to provide sufficient clearance for the case to pass under the closing part, further increasing material costs.

What is needed is a portable flash drive that addresses the cap-loss problem associated with conventional flash drives. What is particularly needed is a swivel-type portable flash drive that overcomes the problems associated with conventional swivel-type devices set forth above.

SUMMARY OF THE INVENTION

The present invention is directed to a swivel-type portable flash device (apparatus) including a flash memory device (and/or other electronic devices) mounted in a housing between upper and lower housing walls, a plug connector (e.g., a USB plug connector) that is electrically connected to the memory device and extends from a front wall portion of the housing, and a substantially C-shaped swivel cover having upper and lower cover walls that are integrally connected by an end wall. The upper and lower cover walls are respectively pivotably attached to the upper and lower housing walls such that the swivel cover is permanently connected to the housing and is manually rotatable in either a clockwise or counterclockwise direction relative to the housing between a first position, in which portions of the upper cover wall and the lower cover wall and the end wall substantially enclose the plug connector, and a second position in which the plug connector is operably exposed for insertion in a host system. By permanently connecting the swivel cover to the housing in this manner, the present invention provides a portable flash device that avoids the cap-loss problem associated with devices having caps that are separated during operation.

In accordance with an aspect of the present invention, outward-facing recessed ring-shaped grooves are respectively formed on the outside surfaces of the upper and lower housing walls, inward-facing ring-shaped protrusions are respectively formed on the inside edge of circular holes and extend perpendicular to the inside surfaces of the upper and lower cover walls, and the swivel cover is permanently rotatably connected to the housing such that the ring-shaped protrusions are respectively movably engaged in the recessed ring-shaped grooves. Attaching the swivel cover to the housing in this manner provides an advantage over conventional swivel-cover devices in that the ring-shaped protrusions greatly increase the structural integrity of the swivel cover by serving as strengthening flanges that resist breakage of the upper and lower cover walls at the circular opening, thereby significantly increasing the expected operating life of the flash device over conventional approaches that utilized flat cover walls. In addition, by disposing the ring-shaped protrusions such that they extend toward the housing and are received in the recessed ring-shaped grooves, the swivel cover can be reliably secured to the housing without the need for a hinge protuberance or other structure that extends above/below the outside surfaces of the upper/lower cover walls, thereby providing a sleeker and more aesthetically pleasing flash device.

In accordance with an embodiment of the present invention, the recessed ring-shaped grooves are located approximately midway between a rear wall portion of the housing and a front edge of the plug connector, whereby when the swivel cover is in the closed position, the end wall of the swivel cover is spaced from the front edge of the plug connector by a minimal offset distance (e.g., 0.25 inches or less, so long as it provides a clearance that is not blocking the rotation path of the swivel cover), and when the swivel cover is manually rotated 180° from the closed position, the end wall of the swivel cover is spaced from the rear wall portion by approximately the same minimal offset distance (e.g., 0.25 inches or less). Locating the recessed ring-shaped grooves in this manner facilitates manufacturing the swivel cover with a minimal length, thus minimizing material costs, and this approach also minimizes the overall length of the flash device when the swivel cover is rotated 180° from the closed position. In alternative embodiments, the recessed ring-shaped grooves may be located anywhere along the length of the housing, but such alternative embodiments would not share the benefits of the midpoint location.

In accordance with another embodiment of the present invention, the end wall of the swivel cover is formed as a substantially semi-cylindrical structure that extends between the upper cover wall and the lower cover wall. Note that it is necessary to bend the swivel cover to separate the end portions of the upper and lower cover walls in order to provide sufficient clearance to mount the ring-shaped protrusions in the recessed ring-shaped grooves. By forming the swivel cover with a substantially semi-cylindrical end wall, the required bending/spreading of the upper and lower cover walls during assembly is achieved without risking permanent deformation of the swivel cover. In alternative embodiments, the end wall may have a rectangular or other angled shape, but such alternative embodiments would not share the benefits of the substantially semi-cylindrical structure.

In accordance with another embodiment of the present invention, locking structures are disposed on the ring-shaped protrusions and in the ring-shaped grooves that served to resist rotation of the swivel cover relative to the housing when the swivel cover is in either of the closed position or the fully open position. That is, because the ring-shaped protrusions extend perpendicular to the upper/lower cover walls and are received in the recessed ring-shaped grooves, the present invention facilitates the addition of simple snap-locking structures that serve to hold the swivel cover in the closed position while minimizing the length and material costs of the swivel cover and the housing in comparison to conventional swivel-type devices, and thus reducing manufacturing costs. In a specific embodiment, the locking structures are implemented by pairs of snap slots are defined on the peripheral edge of the ring-shaped protrusions, and pairs of snap tabs are disposed at the bottom of the ring-shaped grooves, and the swivel cover is biased against the housing such that the peripheral edges of the ring-shaped protrusions ride along the snap tabs until the snap tabs are aligned with and enter into the snap slots. By positioning the snap tabs such that the snap slots engage the snap tabs when the swivel cover is in either of the closed position or opened position, the locking structure serves to resist undesirable exposure of the plug connector during idle periods, thereby extending the operating life of the flash device. In alternative embodiments, the structures on which the snap tabs and snap slots are formed may be reversed (e.g., the snap tabs may be formed on the swivel cover) or other locking structures (e.g., snap tabs that extend from side walls of the ring-shaped protrusions) may be used.

In accordance with some of the disclosed specific embodiments, the swivel cover is attached to the housing such that the ring-shaped protrusions are securely slidably biased (pushed into) the ring-shaped grooves. The biasing force may be provided by the spring-type resilience of the swivel, or by connection structures that are located inside the circular openings defined in the swivel cover, and are entirely disposed between the outermost surfaces of the upper and lower cover walls. By attaching the swivel cover to the housing in this manner, the assembly facilitates the implementation of simple locking structures, such as those described above, and also facilitates reliable connection of the swivel cover to the housing without the need for a hinge protuberance or other structure that extends outside of the outmost surfaces of the upper/lower cover walls, thereby providing a sleeker and more aesthetically pleasing flash device. In accordance with some of the disclosed specific embodiments, connection structures are implemented in the form of rivet caps that are mounted inside the circular openings defined in the swivel cover and extend into rivet openings defined in the upper/lower housing walls. The rivet caps are secured to the housing by way of snap arms or by any other securing means (e.g., ultrasonic welding). In one specific embodiment the rivet caps are formed from transparent or translucent (light permissive) material (e.g., clear plastic) such that light from an activated light source (e.g., an LED) disposed inside the housing is visible through the rivet cap when the flash device is in operation. In accordance with other specific embodiments, the upper/lower housing walls include integrally molded circular attachment structures that are disposed inside of the recessed ring-shaped grooves and extend into the circular openings defined in the swivel cover. The circular attachment structures are either snap-coupled, ultrasonically welded or otherwise disposed to rotatably secure the swivel cover to the housing. In some specific embodiments, a separate light pipe or other viewing structure is disposed in the upper or lower housing wall to display light from an activated light source (e.g., an LED) disposed inside the housing during operation.

In accordance with alternative embodiments of the present invention, the housing is provided either as a two-part housing structure or as a tubular housing structure. In the embodiments employing a two-part housing structure, a PCBA is mounted onto a lower housing portion, and then an upper housing portion is mounted onto and secured (e.g., by ultrasonic welding or snap-coupling) over the lower housing structure. An advantage of the two-part assembly is that the PCBA may be securely held between support structures integrally molded on the inside surfaces of the upper and lower housing portions. In the tubular housing embodiments, a PCBA is inserted through a front or rear opening of a tubular housing, and then secured by way of one or more end caps that are attached (e.g., by ultrasonic welding or snap-coupling) over one or both ends of the tubular housing. An advantage of the single-piece housing arrangement is that the distance between the upper and lower housing walls is reliably set during the molding process, thereby simplifying the assembly process.

In accordance with additional alternative embodiments of the present invention, various features are implemented to further enhance the value and novelty of the flash drive. First, although the exemplary embodiments provided herein include the use of Universal Serial Bus (USB) plug connectors, other plug connector types may also be used. Second, although the exemplary embodiments provided herein include the use of multi-level cell (MLC) packages, other package types such as a Chip-On-Board (COB) package or a Slim Printed Circuit Board Assembly (Slim PCBA) package may also be used. Further, the end wall of the C-shaped swivel cover may be modified to define a pair of key-chain openings that facilitate attaching a key chain or other connector to the flash device. Finally, parallel raised protrusion stripes may be disposed on the side wall portions of the housing to facilitate the manual opening/closing operations (i.e., to improve a user's grip on the device housing in order to prevent his/her fingers from slipping). In other alternative embodiments, the upper and lower housing walls of the housing and upper and lower cover walls of the C-shaped swivel cover are rectangular or other angled shapes (i.e., not curved), but such alternative embodiments would not share the benefits of the substantially curved housing and swivel cover structure.

BRIEF DESCRIPTION OF THE DRAWING

Other features and advantages of the present invention will become apparent in the following detailed description of the preferred embodiment with reference to the accompanying drawings, of which.

DETAILED DESCRIPTION OF THE PREFERRED EMBODIMENT

The present invention relates to an improvement in flash memory devices such as USB flash drives. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
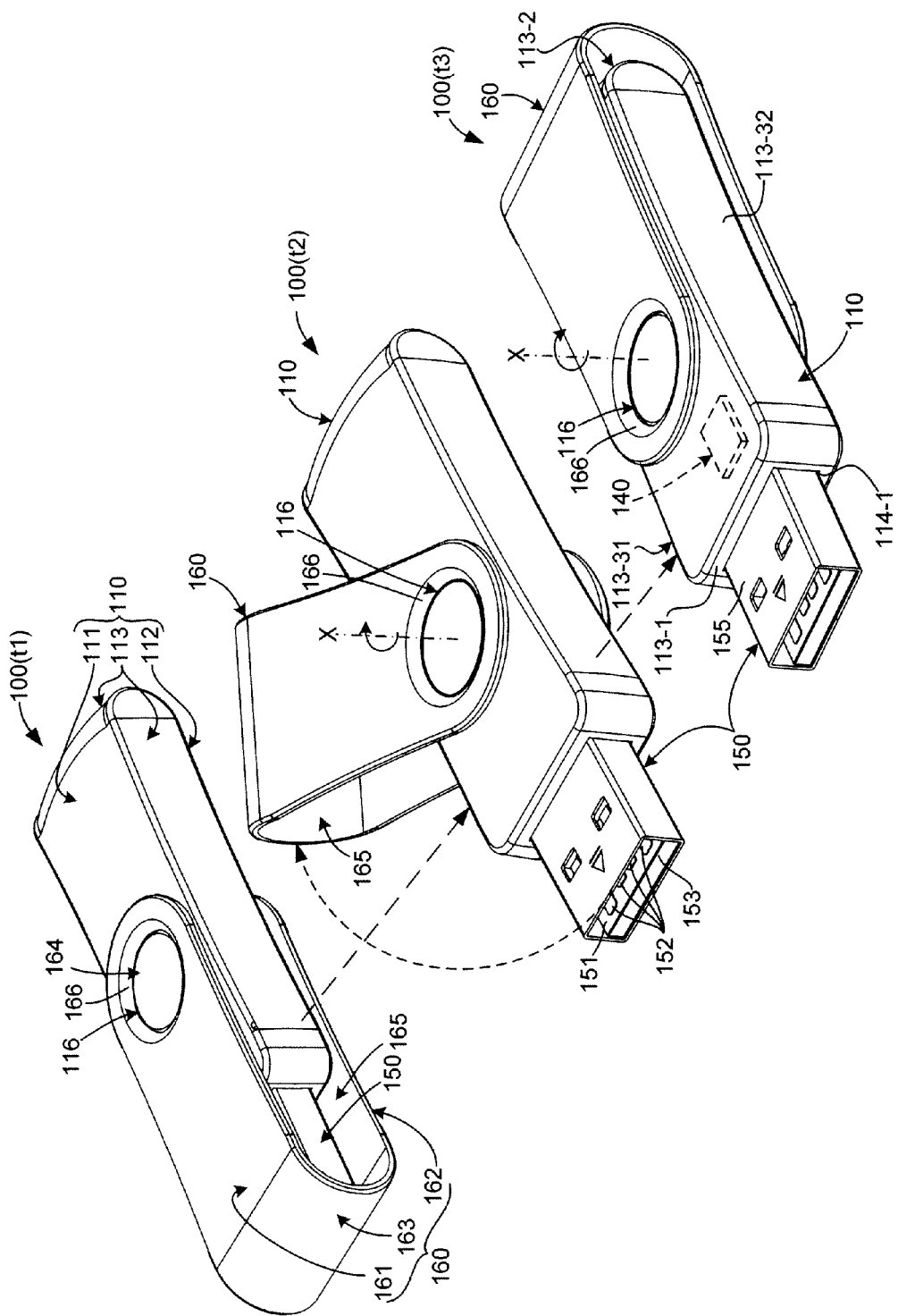
FIG. 1 is a series of perspective views showing a swivel-type flash device according to a generalized embodiment of the present invention.

FIG. 1 is a perspective top view showing a pocket-sized, portable flash device 100 according to a generalized embodiment of the present invention. Flash device 100 generally includes a housing 110 containing at least one electronic device 140, a Universal Serial Bus (USB) plug connector 150, and a C-shaped swivel cover 160 that is rotatably connected to housing 110.

Referring to the upper left portion of FIG. 1, elongated housing 110 includes an upper housing wall 111, a lower housing wall 112, and a peripheral wall 113 that extends between peripheral outer edges of upper housing wall 111 and lower housing wall 112. As indicated in the lower right portion of FIG. 1, peripheral wall 113 includes a front wall portion 113-1, a rear wall portion 113-2, and opposing side wall portions 113-31 and 113-32. Housing 110 is hollow such that an enclosed chamber, in which electronic device 140 is housed, is defined between upper housing wall 111, lower housing wall 112 and peripheral wall 113. Housing 110 is typically formed from molded plastic or metal, and is constructed in accordance with any of the specific embodiments set forth below, or in accordance with conventional techniques.

Plug connector 150 is fixedly connected to front wall portion 113-1 of housing 110. Referring to the bottom right portion of FIG. 1, plug connector 150 includes a substrate 151 having four of metal contacts 152 formed thereon, and an optional metal plug shell 155 that extends through a front opening 114-1 defined in front wall 113-1 of housing 110 and extends over substrate 151 to a front edge 153 of plug connector 150. In the disclosed embodiment, metal contacts 152 are shaped and arranged in a pattern established by the USB specification, and are electronically coupled to device 140 according to known techniques (i.e., such that data stored on device 140 is transferrable in the form of electronic signals to a host system (not shown) by way of metal contacts 152). In alternative embodiments, plug connector 150 may be implemented using any standard plug connector.

C-shaped swivel cover 160 includes an upper cover wall 161 and a lower cover wall 162 that are integrally connected by an end wall 163. Upper cover wall 161 and lower cover wall 162 are substantially parallel sheet-like structures and separated by a distance that corresponds with a thickness of housing 110. That is, referring to FIGS. 2(A) and 2(B), a perpendicular gap distance G separating the inward facing surfaces of upper cover wall 161 and lower cover wall 162 is substantially equal to a housing thickness T1 of housing 110, which is the perpendicular distance between the outermost surface of upper housing wall 111 and the outermost surface of lower housing wall 112. Swivel cover 160 is preferably formed from a resilient material (e.g., elastic plastic or spring steel) such that upper cover wall 161 and lower cover wall 162 resiliently return to their substantially parallel position when bent away from each other during assembly (as described below). Note that upper cover wall 161 and lower cover wall 162 are only connected by way of end wall 163 (i.e., such that swivel cover 160 has open sides and an open front end, and has a closed rear end that is formed by end wall 163), and that an overall thickness T2 of swivel cover 160 is greater than the gap distance G by the combined thicknesses of upper cover wall 161 and lower cover wall 162.

As indicted in FIG. 1, upper cover wall 161 and lower cover wall 162 are respectively pivotably attached to upper housing wall 111 and lower housing wall 112 such that swivel cover 160 is permanently connected to the housing 110 and is manually rotatable relative to the housing 110. In particular, because both sides of swivel cover 160 are open, swivel cover 160 is rotatable either a clockwise or counterclockwise direction relative to housing 110 between a closed (first) position (shown in the upper left portion of FIG. 1), in which portions of upper cover wall 161 and lower cover wall 162 and end wall 163 substantially enclose plug connector 150, and an opened (second) position (indicated in the center and lower right portion of FIG. 1) in which plug connector 150 is operably exposed for insertion in a host system. Note that in this context the phrase "substantially enclosed" is defined herein to mean that upper cover wall 161 entirely covers the top surface of plug connector 150, lower cover wall 162 entirely covers the bottom surface of plug connector 150, and end wall 163 extends over the entire length of the front edge 153 of plug connector 150. In addition, in this context the phrase "operably exposed" is defined herein to mean that swivel cover 160 is rotated on housing 110 sufficiently far so as to allow insertion of plug connector 150 into a host system. By permanently connecting swivel cover 160 to housing 110 in this manner, the present invention provides a portable flash device that avoids the cap-loss problem associated with conventional flash devices having caps that are separated during operation.

Figure 2A:
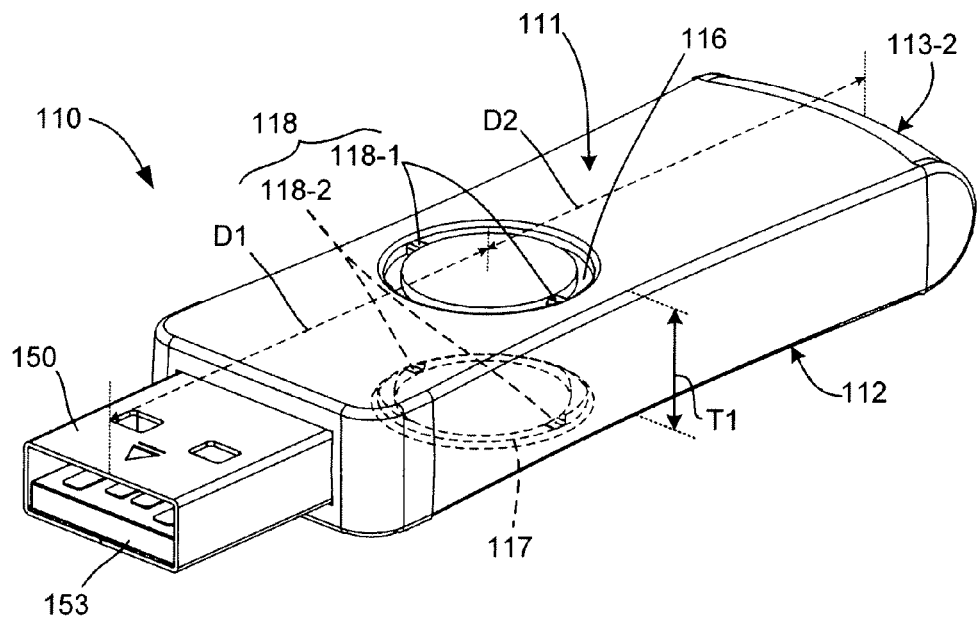
FIGS. 2(A) and 2(B) are perspective views respectively showing a housing and a swivel cover of the swivel-type flash device of FIG. 1 in additional detail.
Figure 2B:
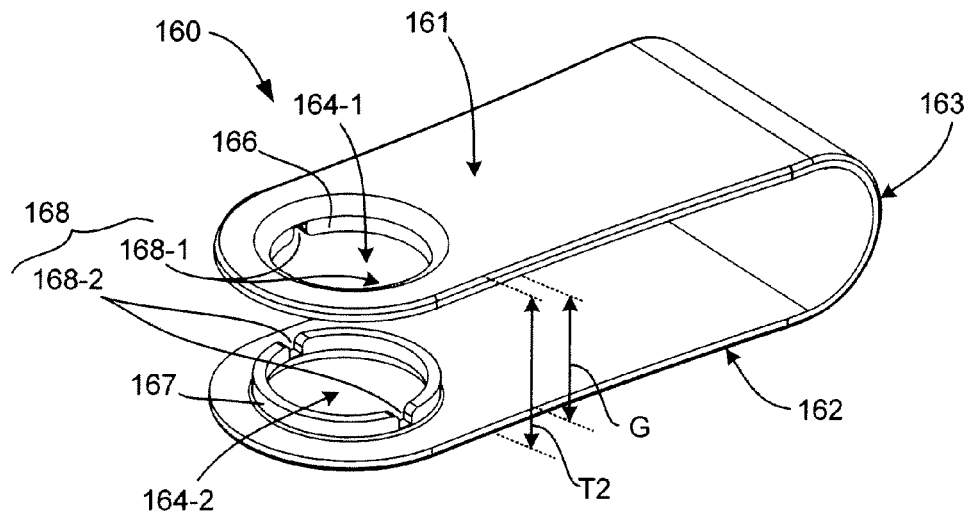

In accordance with an aspect of the present invention, swivel cover 160 is permanently rotatably connected to housing 110 by way of ring-shaped protrusions that are respectively movably engaged in recessed ring-shaped grooves formed in outward-facing surfaces of housing 110. Referring to FIG. 2(A), which is a perspective view showing housing 110, a (first) upward-facing recessed ring-shaped groove 116 is formed (e.g., integrally molded) on upper housing wall 111, and a (second) downward-facing recessed ring-shaped groove 117 is formed on lower housing wall 112 directly below upward-facing recessed ring-shaped groove 116. Referring to FIG. 2(B), which is a perspective view showing swivel cover 160, upper cover wall 161 defines a (first) circular opening 164-1 and lower cover wall 162 defines a (second) circular opening 164-2 that is disposed directly below circular opening 164-1. A (first) ring-shaped protrusion 166 is formed (e.g., integrally molded) on the inside edge of circular hole 164-1 that extends downward from the lower (inward facing) surface of upper cover wall 161, and a (second) ring-shaped protrusion 167 is formed on the inside edge of circular hole 164-2 that extends upward from the upper (inward facing) surface of lower cover wall 162. During assembly, swivel cover 160 is mounted on housing such that ring-shaped protrusion 166 is slidably received in recessed ring-shaped groove 116, and such that ring-shaped protrusion 167 is slidably received in recessed ring-shaped groove 117, whereby swivel cover remains permanently rotatably connected to housing 110 such that the ring-shaped protrusions 166 and 167 are respectively movably engaged in the recessed ring-shaped grooves 116 and 117. As used herein, the phrase "permanently rotatably connected" is defined to mean that swivel cover 160 remains attached to and rotatable on housing 110 in the manner illustrated in FIG. 1 unless swivel cover 160 is forcibly removed from housing 110. As used herein, the phrase "moveably engaged" is defined to mean that s ring-shaped protrusions 166 and 167 are respectively disposed inside and movable relative to recessed ring-shaped grooves 116 and 117 as described below with reference to FIGS. 3(A) and 3(C). Attaching swivel cover 160 to housing 110 in this manner provides an advantage over conventional swivel-cover devices in that ring-shaped protrusions 166 and 167 respectively greatly increase the structural integrity of upper cover wall 166 and lower cover wall 167 by serving as strengthening flanges that resist breakage of the wall material surrounding circular openings 164-1 and 164-2, thereby significantly increasing the expected operating life of flash device 100 over conventional approaches that utilized flat cover walls. In addition, by disposing ring-shaped protrusions 166 and 167 such that they extend toward housing 110 and are received in recessed ring-shaped grooves 116 and 117, swivel cover 160 can be reliably secured to housing 110 without the need for a hinge protuberance or other attaching structure that extends above/below the outside surfaces of upper and lower cover walls 161 and 162, thereby providing flash device 100 with a sleeker and more aesthetically pleasing construction.

Figure 3A:
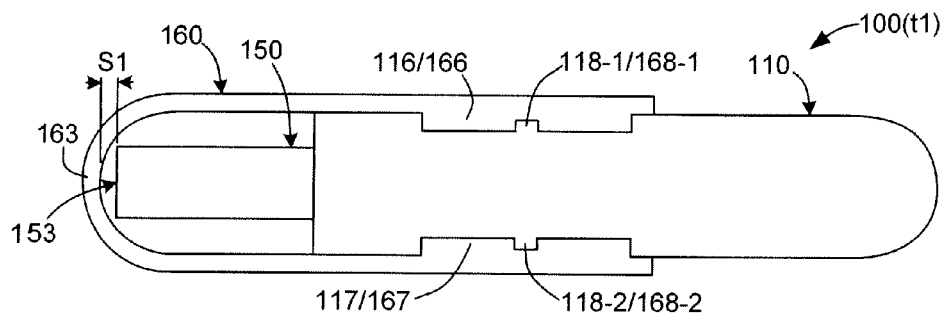
FIGS. 3(A), 3(B) and 3(C) are simplified cross-sectional side views showing the swivel-type flash device of FIG. 1 during operation.
Figure 3B:
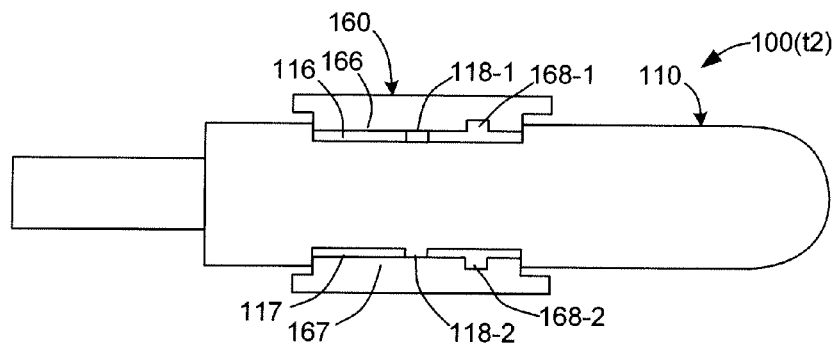
Figure 3C:
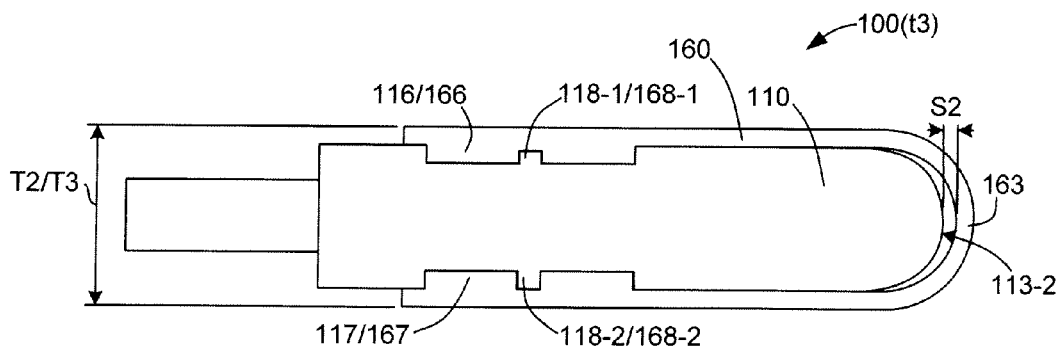

In accordance with an embodiment of the present invention, recessed ring-shaped grooves 116 and 117 are located approximately midway between rear wall portion 113-1 of housing 110 and front edge 153 of plug connector 150. In particular, as indicated with reference to FIG. 2(A), a distance D1 between a center of ring-shaped groove 116 and front edge 153 of plug connector 150 is substantially equal to a distance D2 between the center of ring-shaped groove 116 and rear wall portion 113-2. As indicated in FIG. 3(A), with this arrangement, when swivel cover 160 is in the closed position, the end wall 163 of the swivel cover 160 is spaced from front edge 153 of plug connector 150 by a minimal offset distance S1 (e.g., 0.25 inches or less, so long as it provides a clearance that is not blocking the rotation path of swivel cover 160). Conversely, as indicated in FIG. 3(C), when swivel cover 160 is manually rotated 180° from the closed position (i.e., swivel cover 160 is aligned with housing 110 and end wall 163 is located over rear wall portion 113-2, as shown in the bottom right corner of FIG. 1), end wall 163 is spaced from rear wall portion 113-2 by a minimal offset distance S2 that is substantially equal to distance S1 (e.g., 0.25 inches or less). Locating recessed ring-shaped grooves 116 and 117 in this manner facilitates manufacturing swivel cover 160 with a minimum length, thus minimizing material costs, and this approach also minimizes the overall length of flash device 100 when swivel cover 160 is rotated 180° from the closed position. In alternative embodiments (not shown), the recessed ring-shaped grooves may be located at another location along the length of housing 110, but such alternative embodiments would not share the benefits of the midpoint location shown in FIG. 2(A).

In accordance with another embodiment of the present invention, as indicated in FIG. 2(B), rear wall portion 113-2 of housing 110 comprises a (first) substantially semi-cylindrical structure extending between upper housing wall 111 and the lower housing wall 112, and end wall 163 is formed as a (second) substantially semi-cylindrical structure that extends between upper cover wall 161 and lower cover wall 162. As mentioned above, upper and lower cover walls 161 and 162 are bent away from each to increase the distance between ring-shaped protrusions 166 and 167 during assembly of swivel cover 160 onto housing 110 in order to provide sufficient clearance for mounting ring-shaped protrusions 166 and 167 in recessed ring-shaped grooves 116 and 117, respectively. By forming end wall 163 as a substantially semi-cylindrical structure, the required bending/spreading of upper and lower cover walls 161 and 162 during this assembly step is achieved without risking permanent deformation of the swivel cover. In alternative embodiments, the end wall may have a rectangular or other angled shape, but such alternative embodiments may not exhibit the resilience of the substantially semi-cylindrical structure mentioned above.

Referring to FIGS. 2(A) and 2(B), according to another embodiment of the present invention, snap-type cooperative locking structures 118 and 168 are respectively disposed in at least one of ring-shaped grooves 116 and 117 of housing 110 and on at least one of ring-shaped protrusions 166 and 167 of swivel cover 160 that served to resist rotation of swivel cover 160 relative to housing 110 when swivel cover 160 is in either of the closed position or the fully open position. Because the ring-shaped protrusions 166 and 167 extend perpendicular to the upper and lower cover walls 161 and 162, respectively, and are received in the recessed ring-shaped grooves 116 and 117 of the upper and lower housing walls 111 and 112, respectively, the present invention facilitates the addition of simple snap-locking structures 118 and 168 that serve to hold swivel cover 160 in the closed position while minimizing the overall length and material costs of swivel cover 160 and housing 110 in comparison to conventional swivel-type devices, and thus reducing manufacturing costs.

In the exemplary embodiment shown in FIGS. 2(A) and 2(B), locking structure portions 118 are implemented by pairs of snap tabs 118-1 and 118-2 respectively disposed inside ring-shaped grooves 116 and 117, and locking structure portions 168 are implemented by pairs of snap slots 168-1 and 168-2 respectively defined on the peripheral edge of the ring-shaped protrusions 166 and 167. Swivel cover 160 is biased against the housing 110 (e.g., by way of resilient elastic force generated by the clip-like swivel cover structure, or by way of a separate fastener) such that the peripheral edges of the ring-shaped protrusions 166 and 167 are pressed into recessed ring-shaped grooves 116 and 117, respectively. As illustrated in FIGS. 3(A) to 3(C), this arrangement causes snap slots 168-1 and 168-2 to enter and engage snap tabs 118-1 and 118-2, respectively, when swivel cover 160 is in either the closed position (e.g., as illustrated in FIG. 3(A)) or in the fully opened position (e.g., as illustrated in FIG. 3(C)). When swivel cover 160 is between the fully closed and fully opened position, the peripheral edges of the ring-shaped protrusions 166 and 167 are pressed against and slide along the upper edges of snap tabs 118-1 and 118-2 until snap tabs 118-1 and 118-2 are again aligned with and enter into snap slots 168-1 and 168-2. By positioning the snap tabs 118-1 and 118-2 such that snap slots 168-1 and 168-2 engage snap tabs 118-1 and 118-2 when swivel cover 160 is in either of the fully opened or closed position, locking structures 118 and 168 serve to resist undesirable exposure of plug connector 150 during idle periods, thereby extending the operating life of flash device 100.

Referring to FIG. 3(C), in accordance with another aspect of the present invention, the swivel cover 160 is attached to housing 110 such that, as indicated in FIG. 3(C), a maximum overall thickness T3 of flash device 100 is equal to thickness T2 between the outermost surfaces of upper cover wall 161 and lower cover wall 162. That is, unlike conventional swivel-type flash devices in which the overall device thickness is defined by hinge protrusions, flash devices produced in accordance with the present invention are characterized in that ring-shaped protrusions 166 and 167 are securely respectively slidably biased (pushed into) recessed ring-shaped grooves 116 and 117 either by spring forces generated by swivel cover 160, or by connection structures (e.g., such as connection structures utilized in the various specific embodiments described below) that are entirely disposed inside the region separating the outermost surfaces of upper cover wall 161 and lower cover wall 162. By attaching the swivel cover 160 to the housing in this manner, the assembly provides a sleeker and more aesthetically pleasing flash device structure.

Alternative features of the present invention will now be described with reference to certain specific embodiments whose features are intended to be exemplary and not limiting unless otherwise specified in the claims.

Figure 4:
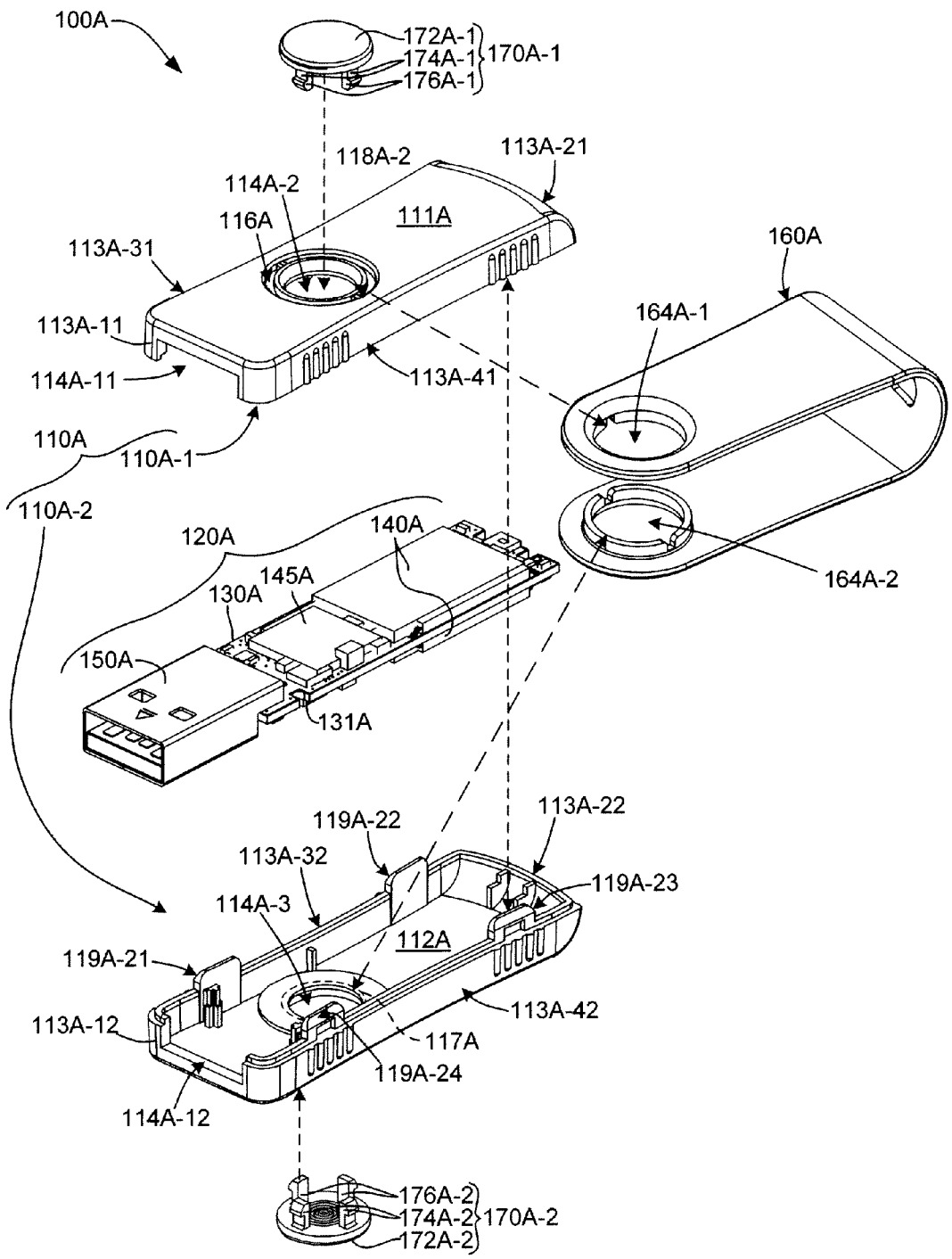
FIG. 4 is an exploded perspective view showing a swivel-type flash device according to a first specific embodiment of the present invention.

FIG. 4 is an exploded perspective view showing a swivel-type flash device 100A according to a first specific embodiment of the present invention. Similar to the previously described general embodiment, flash device 100A includes a PCBA 120A, a housing 110A, and a swivel cover 160A.

Referring to the center of FIG. 4, PCBA 120A generally includes a printed circuit board PCB 130A, two memory devices 140A respectively mounted on opposite sides of PCB 130A, a plug connector 150A fixedly attached at a front end of PCB 130A, a controller (not shown) mounted on a lower surface of PCB 130A, and an LED 147A mounted on an upper surface of PCB 130A between memory devices 140A and plug connector 150A. Additional components as needed for the described operation of flash device 150A are also disposed on PCB 130A. According to a preferred embodiment, PCBA 120A is constructed as a multi-level cell (MLC) package, although in alternative embodiments other package types may also be used, such as a Chip-On-Board (COB) package or a Slim Printed Circuit Board Assembly (Slim PCBA) package.

In the present embodiment, housing 110A is a two-part housing structure including an upper housing portion 110A-1 and a lower housing portion 110A-2. Referring to the upper portion of FIG. 4, upper housing portion 110A-1 includes upper wall 111A and peripheral side wall portions 113A-11, 113A-21, 113A-31 and 113A-41 extending downward from the front, rear and side region edges of upper wall 111A, respectively. Similar to the generalized embodiment, a front opening portion 114A-11 is formed in front half wall portion 113A-11, and a recessed ring-shaped groove 116A is formed in upper wall 111A. Referring to the lower portion of FIG. 4, lower housing portion 110A-2 includes lower wall 112A and peripheral side wall portions 113A-12, 113A-22, 113A-32 and 113A-42 extending upward from the front, rear and side region edges of lower wall 112A, respectively. A second front opening portion 114A-12 is formed in front half wall portion 113A-12, and a downward-facing recessed ring-shaped groove 117A is formed in lower wall 112A. Lower housing portion 110A-2 also includes four snap-coupling male structures 119A-21, 119A-22, 119A-23 and 119A-24 that operably engage corresponding female structures (not shown) that are disposed inside upper housing portion 110A-1 when upper housing portion 110A-1 is aligned with and pressed downward onto lower housing portion 110A-2.

Referring to the center-right portion of FIG. 4, swivel cover 160A is similar to exemplary swivel cover 160 of the generalized embodiment (described above), and therefore will not be described in additional detail here.

In accordance with another aspect of the present embodiment, swivel cover 160A is attached to housing 110A by way of rivet caps (connection structures) 170A-1 and 170A-2 that are respectively mounted into circular openings 164A-1 and 164A-2 of swivel cover 160A, and connected over rivet openings 114A-2 and 114A-3 that are defined or otherwise formed in upper wall 111A and lower wall 112A, respectively. Note that rivet openings 114A-2 and 114A-3 are disposed inside recessed ring-shaped grooves 116A and 117A, and in the disclosed embodiment pass entirely through upper wall 111A and lower wall 112A, respectively. Rivet cap 170A-1 has an upper cap portion 172A-1, four snap arms (base structures) 174A-1 extending downward from upper cap portion 172A-1, and snap claws 176A-1 disposed at the lower end of each snap arm 174A-1. Similarly, rivet cap 170A-2 has a lower cap portion 172A-2, four snap arms 174A-2 extending upward from cap portion 172A-2, and snap claws 176A-2 disposed at the upper end of each snap arm 174A-2. Rivet caps 170A-1 and 170A-2 are respectively pressed into openings 114A-2 and 114A-3 to snap-couple (secure) swivel cover 160A to housing 110A in the manner described in additional detail below.

Figure 5A:
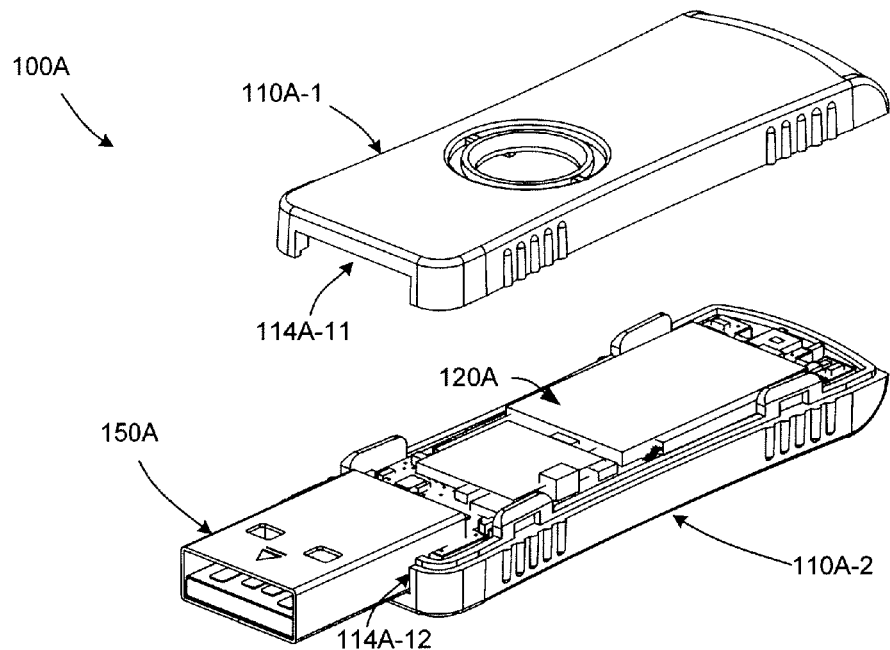
FIGS. 5(A), 5(B) and 5(C) are perspective views depicting portions of the swivel-type flash device of FIG. 4 during assembly.
Figure 5B:
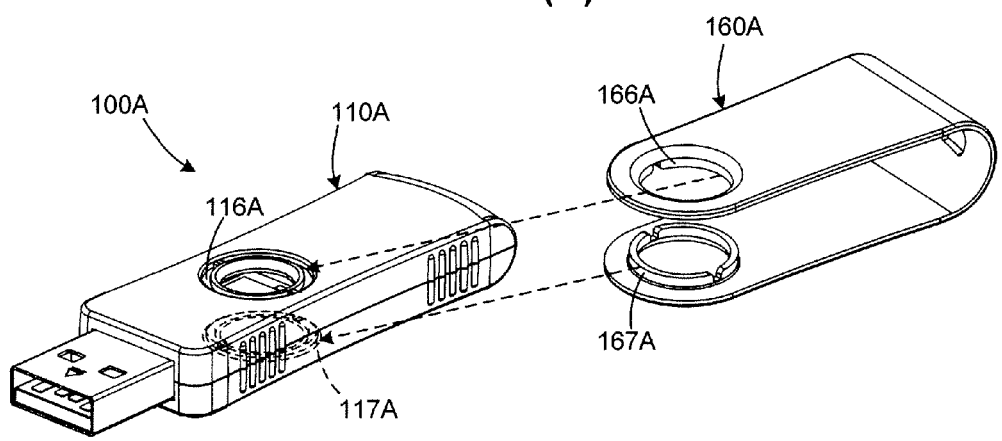
Figure 5C:
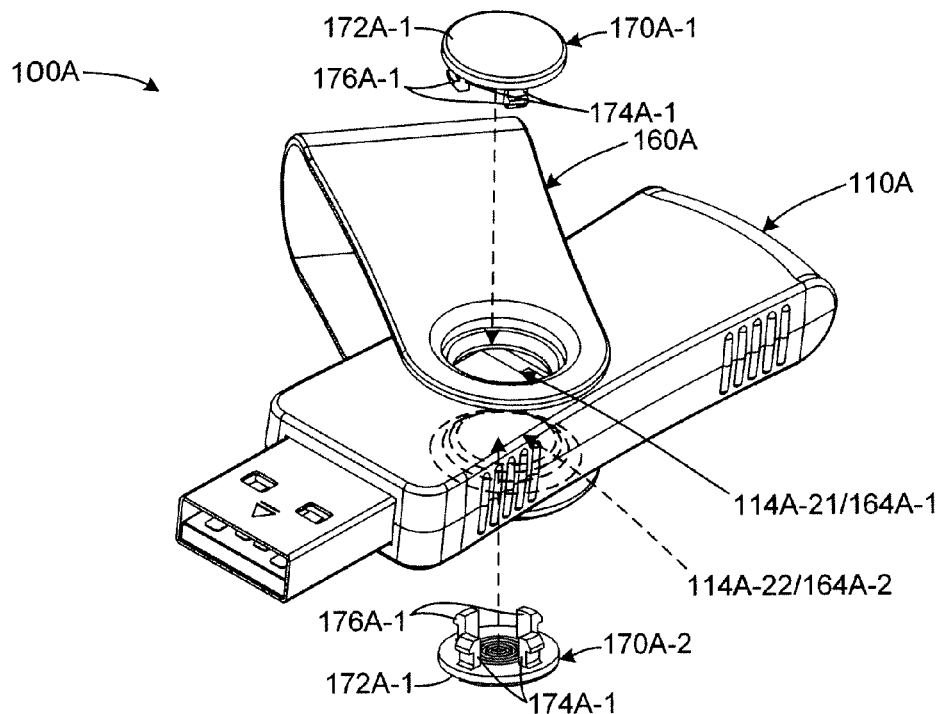

FIGS. 5(A) to 5(C) are partial perspective views illustrating an assembly process utilized in the production of flash device 100A according to another embodiment of the present invention.

FIG. 5(A) depicts a first portion of the assembly process in which PCBA 120A is mounted onto lower housing portion 110A-2 such that a portion of plug connector 150A extends through front opening portion 114A-12, and then upper housing portion 110A-1 is mounted onto lower housing portion 110A-2 as depicted by the dashed-line arrows, whereby the upper section of plug connector 150A is received inside front opening portion 114A-11. In the present embodiment upper housing portion 110A-1 is secured to lower housing portion 110A-2 by way of snap coupling structures in the manner described above. In alternative embodiments, upper housing portion 110A-1 is secured to lower housing portion 110A-2 using an adhesive or ultrasonic welding.

FIG. 5(B) depicts a second portion of the assembly process of flash device 100A in which swivel cover 160A is mounted onto housing 110A such that ring-shaped protrusions 166A and 167A are engaged in recessed ring-shaped grooves 116A and 117A, respectively, in the manner described above with reference to the generalized embodiment.

FIG. 5(C) depicts a second portion of the assembly process in which rivet caps 170A-1 and 170A-2 are utilized to secure swivel cover 160A onto housing 110A. In particular, as indicated by the dashed-lined arrows, rivet cap 170A-1 is mounted onto upper wall 111A such that snap arms 174A-1 enter into circular opening 164A-1 and upper rivet opening 114A-1, and rivet cap 170A-2 is mounted onto lower wall 112A such that snap arms 174A-2 enter into circular opening 164A-2 and upper rivet opening 114A-2. Each of rivet caps 170A-1 and 170A-2 is pressed into housing 110A until snap claws 176A-1 and 176A-2 operably engage inside edges of rivet openings 114A-1 and 114A-2, respectively.

Figure 6:
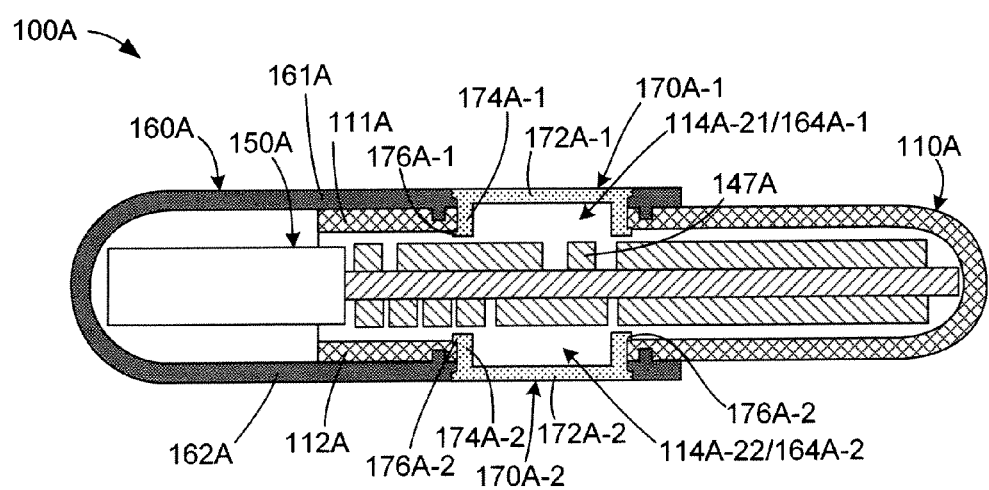
FIG. 6 is a simplified cross-sectional view showing the swivel-type flash device of FIG. 4 in additional detail.

FIG. 6 is a simplified cross-sectional side view showing flash device 100A after assembly is completed. Upper rivet cap 170A-1 is operably engaged such that such that snap arms 174A-1 extend through circular opening 164A-1 and snap claws 176A-1 are hooked onto upper wall 111A, and lower rivet cap 170A-2 is operably engaged such that such that snap arms 174A-2 extend through circular opening 164A-2 and snap claws 176A-2 are hooked onto lower wall 112A. Note that cap portions 172A-1 and 172A-2 are respectively recessed inside circular openings 164A-1 and 164A-2 such that rivet caps 170A-1 and 170A-2 are entirely disposed between the outermost surfaces of the upper and lower cover walls 161A and 162A of swivel cover 160A. By attaching swivel cover 160A to housing 110A in this manner, the present invention facilitates the implementation of simple locking structures, such as those described above with reference to the generalized embodiment, and also facilitates reliable connection of swivel cover 160A to housing 110A without the need for a hinge protuberance or other structure that extends outside of the outmost surfaces of the upper/lower cover walls, thereby making flash device 100A sleeker and more aesthetically pleasing.

Although rivet caps 170A-1 and 170A-2 are described herein as being attached using a snap-coupling mechanism, other fastening methods may also be used. For example, a similar rivet cap structure (not shown) may include arms that extend into or abut a corresponding structure disposed on the upper and lower walls of the housing, and are secured by way of adhesive, ultrasonic welding or rivet caps integrally molded to the wall surfaces of the upper and lower housing portions.

In addition, as indicated in FIG. 6, one or more of rivet caps 170A-1 and 170A-2 may be formed of a clear plastic or otherwise light transparent material such that light from an activated light source (e.g., an LED 147A) that disposed inside housing 110A is visible through rivet cap 170A-1 when flash device 100A is operably connected to a host system.

Figure 7A:
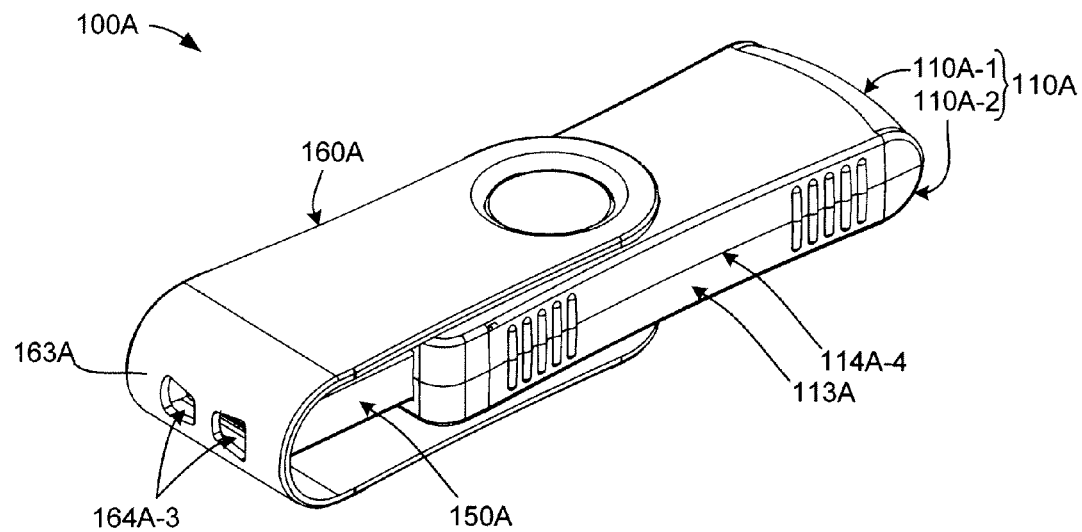
FIGS. 7(A) and 7(B) are top front perspective views showing the swivel-type flash device of FIG. 4 in an assembled state.
Figure 7B:
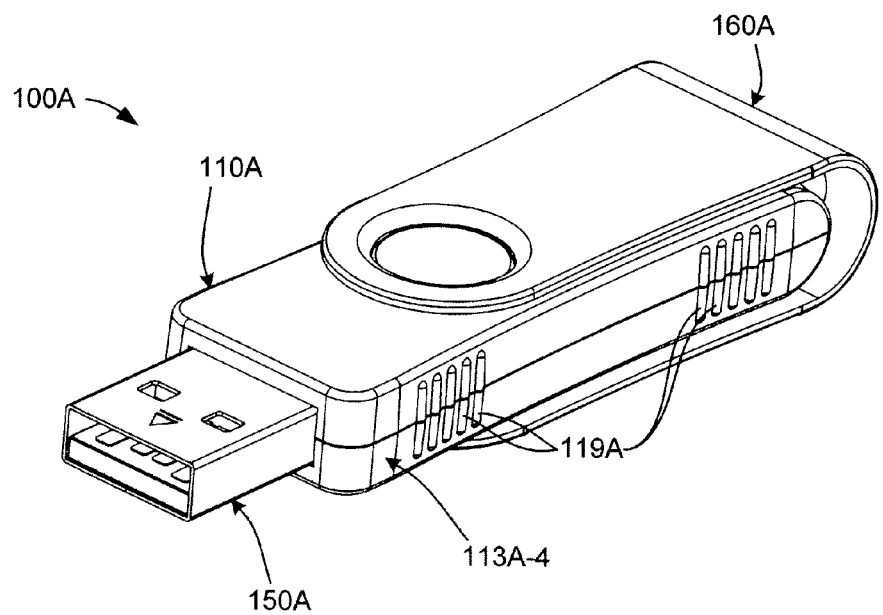

FIGS. 7(A) and 7(B) are top front perspective views showing fully assembled flash device 100A in the fully closed and fully opened positions, respectively. Similar to the generalized embodiment, in the fully closed position (FIG. 7(A)), swivel cover 160A substantially entirely encloses plug connector 150A, and in the fully opened position (FIG. 7(B)), swivel cover 160A is disposed behind housing 110A such that plug connector 150A can be inserted into a host system (not shown). As indicated in FIG. 7(A), two-part housing 110A is made up of upper housing portion 110A-1 and lower housing portion 110A-2 that are connected together along a seam 114A-4 defined in peripheral wall 113A.

According to an alternative feature shown in FIG. 7(A), flash device 100A includes two key chain openings 164A-3 that are defined in end wall 163A of the C-shaped swivel cover 160A to facilitate attaching flash device 100A to a key chain. According to another alternative feature shown in FIG. 7(B), housing 110A is provided with parallel raised protrusion stripes 119A disposed on side wall portions 113A-31 and 113A-32 to facilitate the manual opening/closing operations. That is, protrusion stripes 119A serve to improve a user's grip on housing 110A (i.e., to prevent his/her fingers from slipping) when opening/closing swivel cover 160A.

Figure 8:
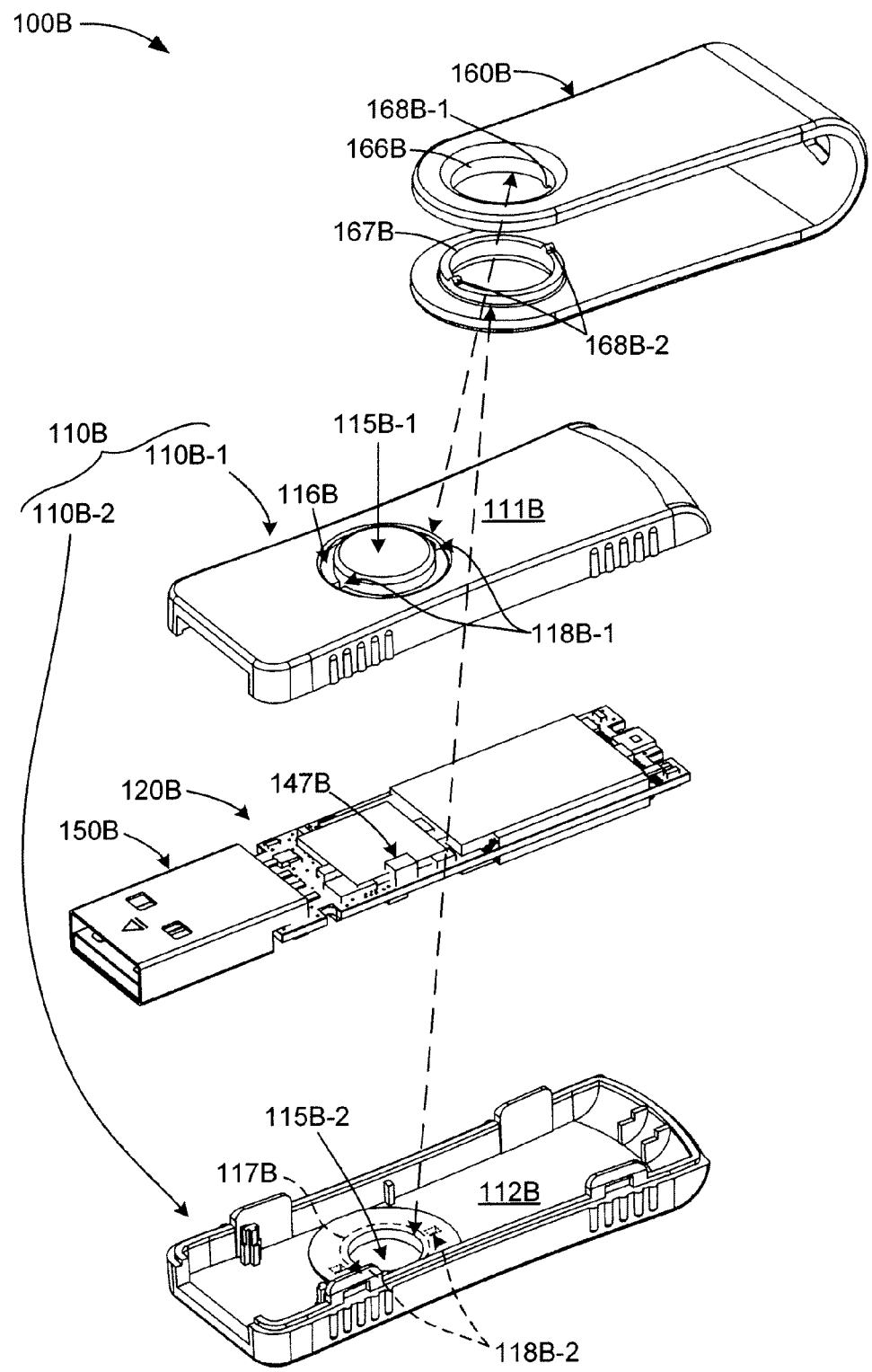
FIG. 8 is an exploded perspective view showing a swivel-type flash device according to a second specific embodiment of the present invention.

FIG. 8 is an exploded perspective view showing a swivel-type flash device 100B according to a second specific embodiment of the present invention. Similar to flash device 100A, flash device 100B includes a MLC-type PCBA 120B, a two-part housing 110B, and a swivel cover 160B. PCBA 120B is essentially identical to PCBA 120A and will therefore not be described in additional detail below.

In accordance with a feature of the present embodiment, the locking structures used to hold swivel cover 160B in the fully closed and fully opened positions on housing 110B are reversed. That is, swivel cover 160B is fabricated such that snap tabs 168B-1 and 168B-2 are respectively formed on ring-shaped protrusions 166B and 167B, and housing 110B is formed such that snap slots 118B-1 and 118B-2 are respectively defined in recessed ring-shaped grooves 116B and 117B, respectively. This locking structure operates in essentially the same manner as the locking structure described above with reference to the generalized embodiment, and swivel cover 160B is otherwise identical in form and function to swivel cover 160A of the generalized embodiment.

Flash device 100B also differs from flash device 100A in that swivel cover 160B is secured to housing 110B without the use of rivet caps. In the present embodiment, the rotatable connection of swivel cover 160B to housing 110B is implemented by circular connection structures 115B-1 and 115B-2, which are integrally molded on the upper housing wall 111B and lower housing wall 112B, respectively, and extending into circular holes 164B-1 and 164B-2 of swivel cover 160B in a manner similar to that achieved by the rivet caps of the previously described embodiment (i.e., such that separation of swivel cover 160B from housing 110B is resisted, but that swivel cover 160B is able to rotate on housing 110B in the manner described above).

Figure 9A:
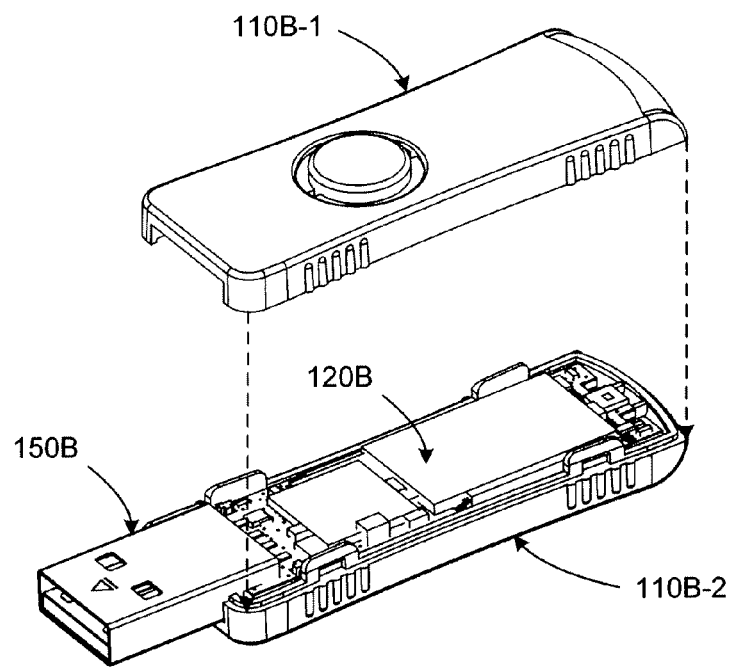
FIGS. 9(A) and 9(B) are perspective views depicting portions of the swivel-type flash device of FIG. 8 during assembly.
Figure 9B:
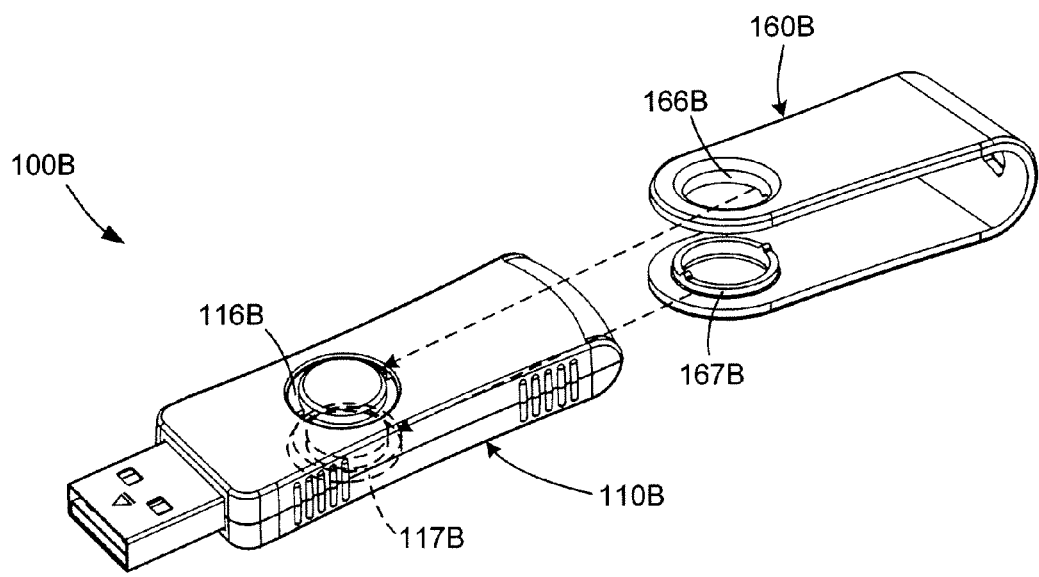

FIGS. 9(A) and 9(B) are partial perspective views illustrating an assembly process utilized in the production of flash device 100B according to another embodiment of the present invention.

FIG. 9(A) depicts a first portion of the assembly process in which PCBA 120B is mounted onto lower housing portion 110B-2 such that a portion of plug connector 150B extends from a front end thereof, and then upper housing portion 110B-1 is mounted onto lower housing portion 110B-2 as depicted by the dashed-line arrows, and then upper housing portion 110B-1 is secured to lower housing portion 110B-2 by way of snap coupling.

FIG. 9(B) depicts a second portion of the assembly process in which swivel cover 160B is mounted onto housing 110E such that ring-shaped protrusions 166E and 167B are engaged in recessed ring-shaped grooves 116E and 117B, respectively, in a manner similar to that described above with reference to the generalized embodiment. However, in this case ring-shaped protrusions 166B and 167B are mounted over circular connection structures 115B-1 and 115B-2 and pressed downward such that the distal ends of circular connection structures 115B-1 and 115B-2 are forced into circular holes 164B-1 and 164B-2.

Figure 10:
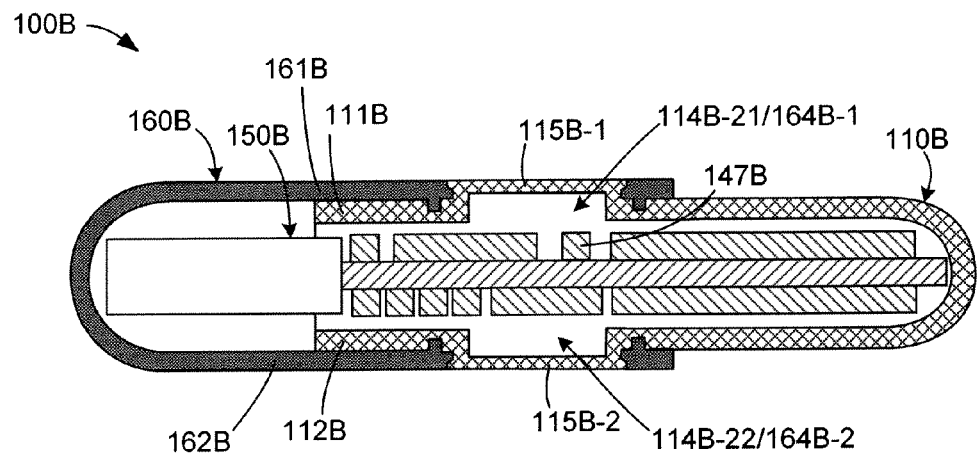
FIG. 10 is a simplified cross-sectional view showing the swivel-type flash device of FIG. 8 in additional detail.
Figure 11:
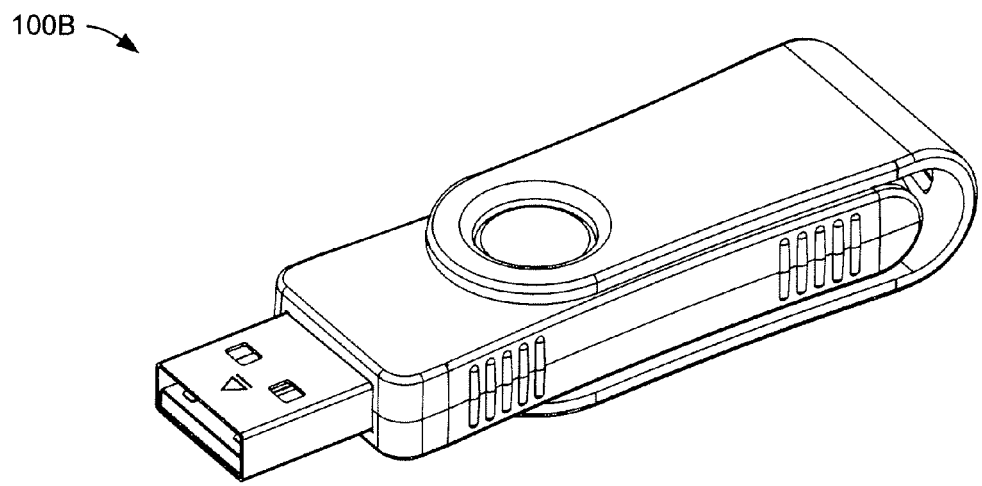
FIG. 11 is a top front perspective view showing the swivel-type flash device of FIG. 8 in an assembled state.

FIG. 10 is a simplified cross-sectional side view showing flash device 100B after assembly is completed. Upper circular connection structure 115B-1 is operably engaged inside circular opening 164B-1, and lower circular connection structure 115B-2 is operably engaged inside circular opening 164A-2 such that removal of swivel cover 160B from housing 110B is resisted. Note that circular connection structures 115B-1 and 115B-2 are respectively recessed inside circular openings 164B-1 and 164B-2 such that their distal ends are entirely disposed between the outermost surfaces of the upper and lower cover walls 161B and 162B of swivel cover 160B. Light from an LED 147B may be viewed through upper circular connection structure 115B-1 when housing 110B is formed using an opaque or translucent plastic. FIG. 11 is a top front perspective view showing flash device 100B in the fully opened position.

Figure 12:
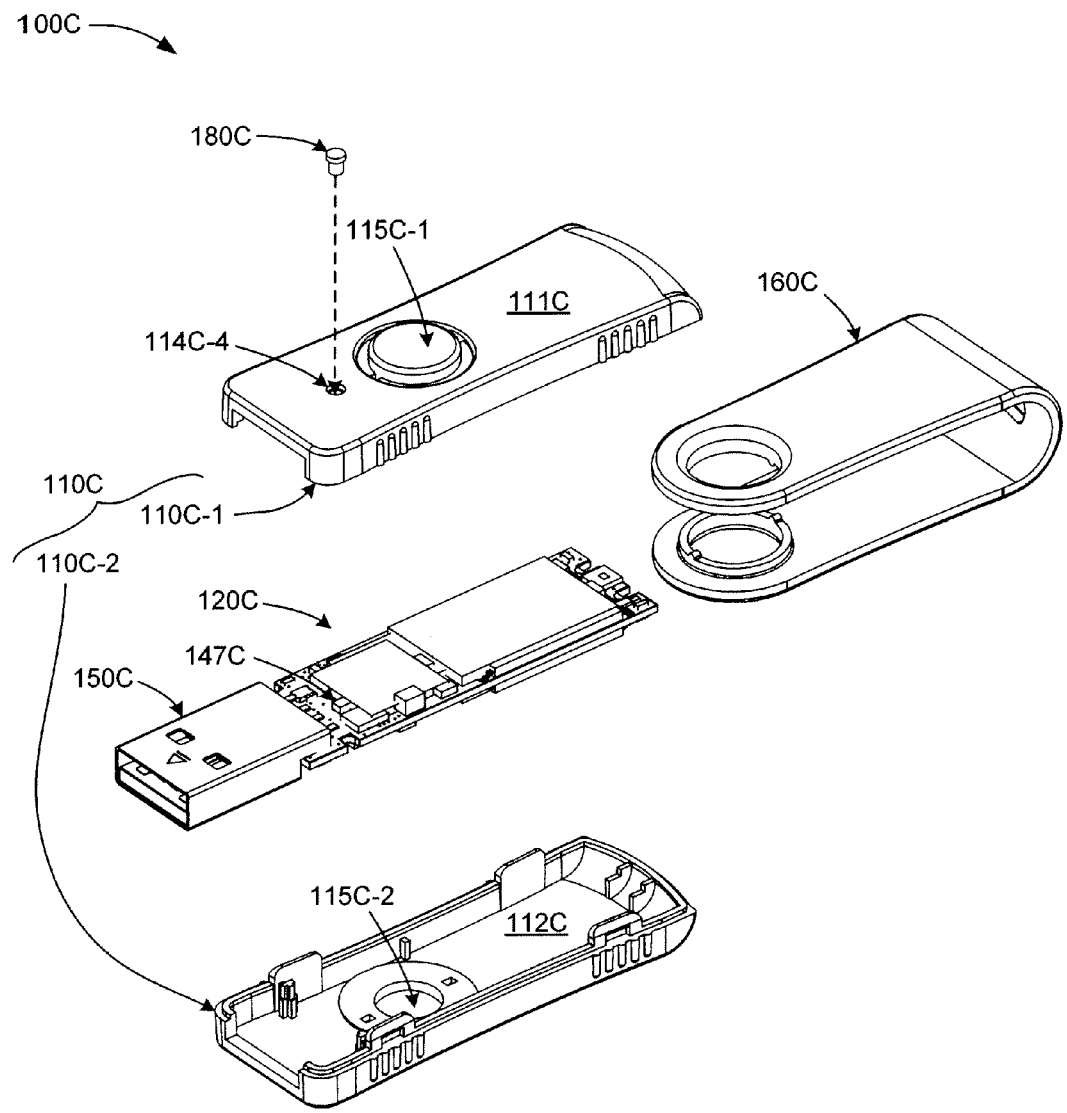
FIG. 12 is an exploded perspective view showing a swivel-type flash device according to a third specific embodiment of the present invention.

FIG. 12 is an exploded perspective view showing a swivel-type flash device 100C according to a third specific embodiment of the present invention. Similar to flash device 100B, flash device 100C includes an MLC-type PCBA 120C, a two-part housing 110C, and a swivel cover 160C. Swivel cover 160C is essentially identical to swivel cover 160B (described above), and will therefore not be described in additional detail below. Flash device 100C differs from flash device 100B in that PCBA 120C includes an LED (or other light source) 147C disposed adjacent to plug connector 150C, upper housing wall 111C defines an LED hole 114C-4, and device 100C also includes a light pipe 180C that is mounted inside LED hole 114C-4 and positioned above LED 147C.

Figure 13:
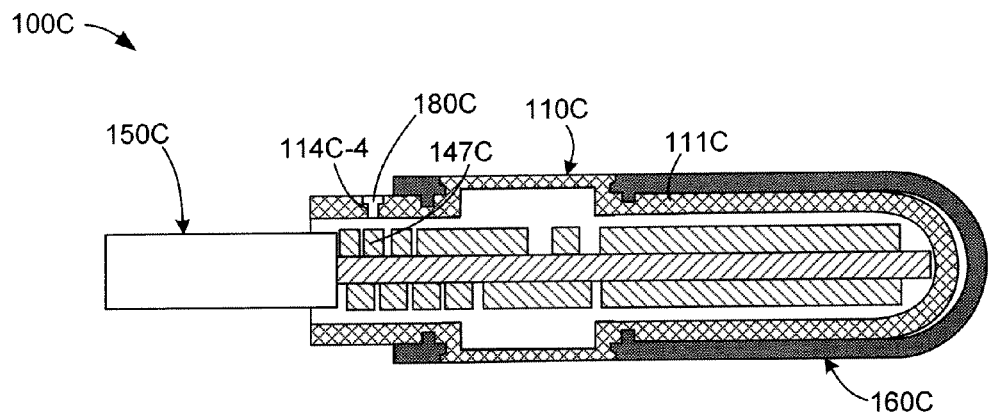
FIG. 13 is a simplified cross-sectional view showing the swivel-type flash device of FIG. 12 in additional detail.
Figure 14:
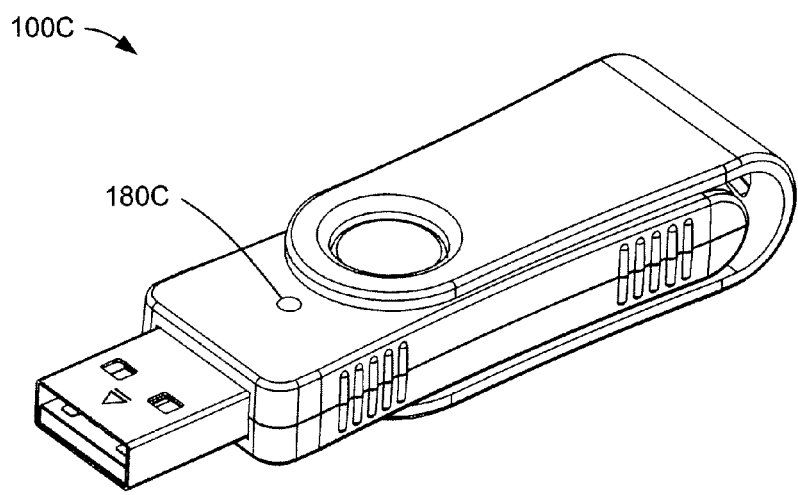
FIG. 14 is a top front perspective view showing the swivel-type flash device of FIG. 12 in an assembled state.

FIG. 13 is a simplified cross-sectional side view showing flash device 100C after assembly is completed. LED 147C is disposed below an aligned with light pipe 180C, and LED 147C is operably controlled such that when flash device 100C is in the fully open position and operably inserted into a host system, LED 147C generates light that is visible by way of light pipe 180C. That is, when swivel cover 160C is rotated around to the back side of housing 110C and the front portion of upper wall 111C including LED hole 114C-4 is visible to a user (as indicated in FIG. 14) and flash device 100C is operably engaged and communicating with a host system (not shown), the operating condition of flash device 100C is easily determined by way of light passing through light pipe 180C.

Figure 15:
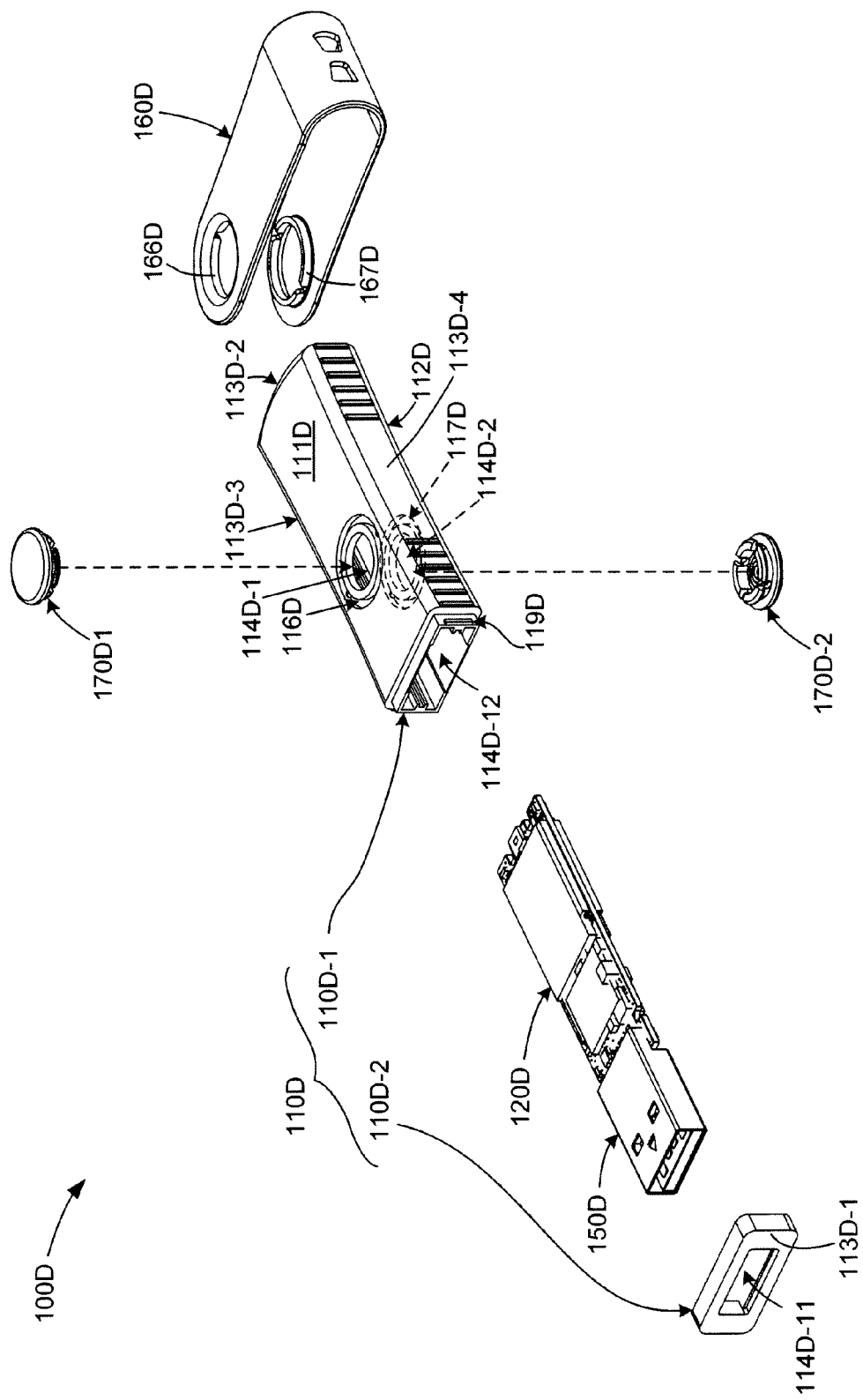
FIG. 15 is an exploded perspective view showing a swivel-type flash device according to a fourth specific embodiment of the present invention.

FIG. 15 is an exploded perspective view showing a swivel-type flash device 100D according to a fourth specific embodiment of the present invention. Similar to flash device 100A, flash device 100D includes an MLC-type PCBA 120D, a housing 110D, a swivel cover 160D and two rivet caps 170D-1 and 170D-2. Rivet caps 170D-1 and 170D-2 and swivel cover 160D are essentially identical to corresponding structures described above.

Flash device 100D differs from the previously described embodiments in that housing 100D includes a housing 110D made up of a tubular housing portion 110D-1 and a front end cap 110D-2. Tubular housing portion 110D-1 is an integrally molded plastic structure including an upper wall 111D, a lower wall 112D, a rear wall 113D-2, and side walls 113D-3 and 113D-4. Similar to the first specific embodiment, upper wall 111D includes a recessed ring-shaped groove 116D surrounding an upper rivet opening 114D-1, and lower wall 112D includes a recessed ring-shaped groove 117D surrounding a lower rivet opening 114D-2. The front end of tubular housing portion 110D-1 defines an opening 114D-12 and includes one or more snap-lock structures 119D. Front end cap 110D-2, which forms front wall 113D-1 of housing 110D when attached onto tubular housing portion 110D-1, defines front opening 114D-11 that is sized to fit tightly over plug connector 150D.

Figure 16A:
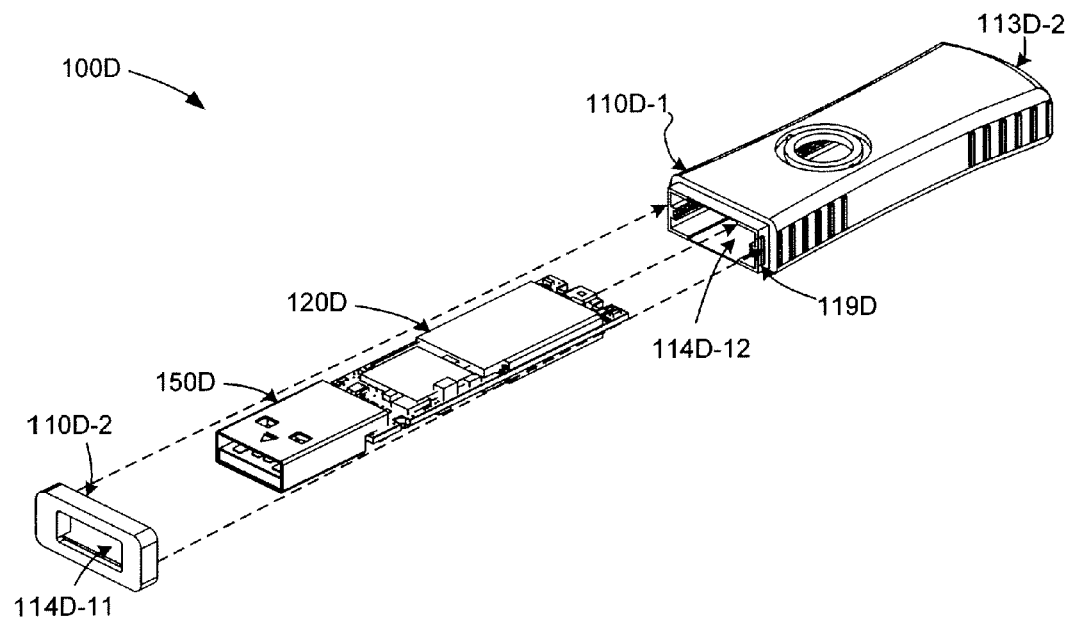
FIGS. 16(A), 16(B) and 16(C) are perspective views depicting portions of the swivel-type flash device of FIG. 15 during assembly.
Figure 16B:
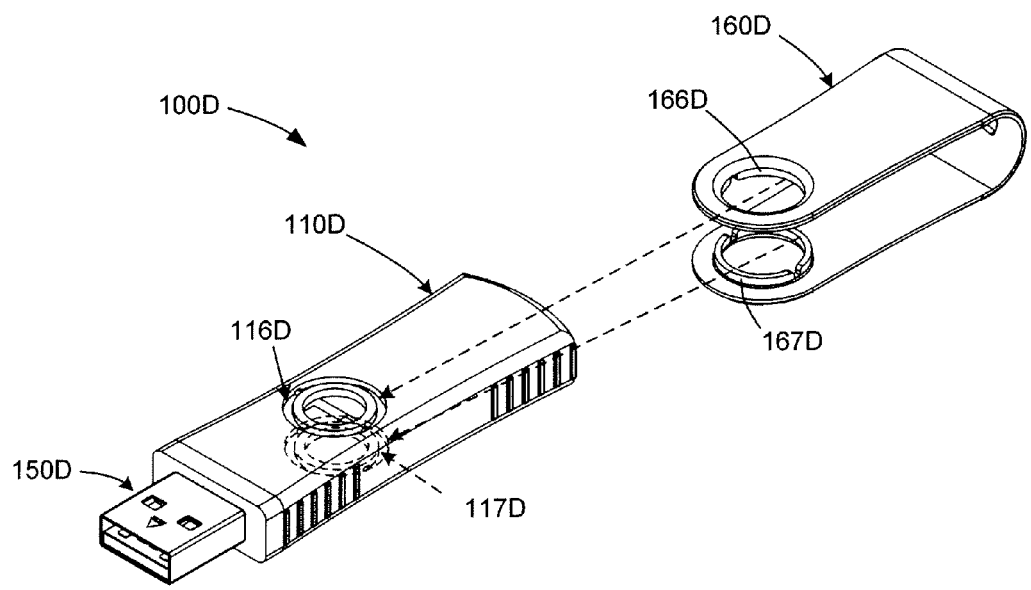
Figure 16C:
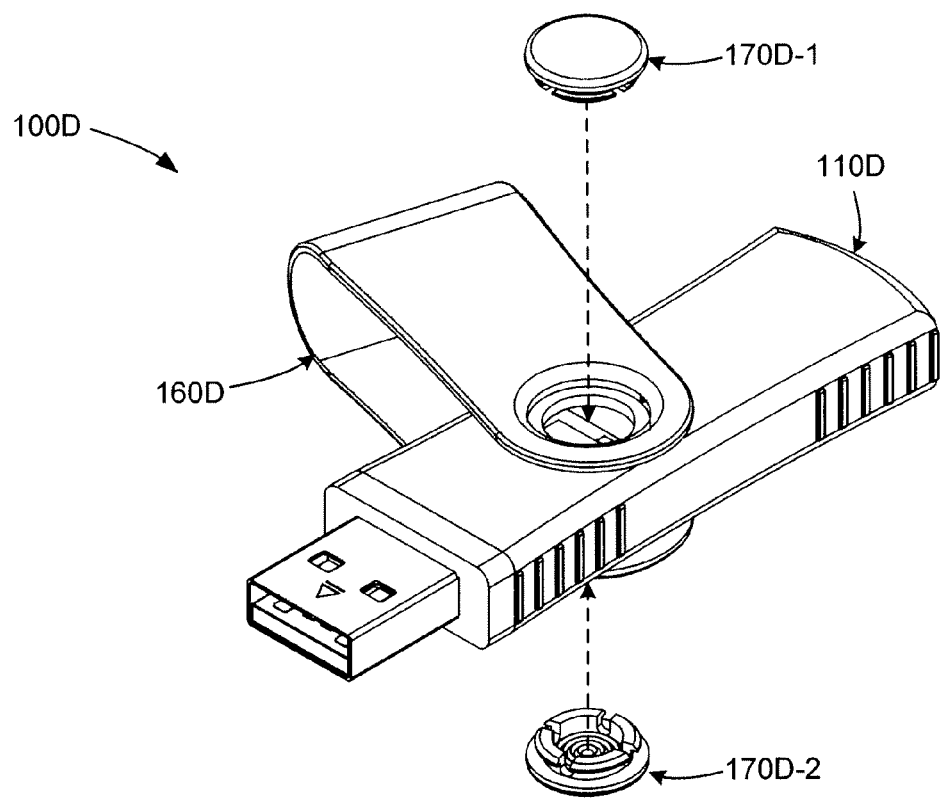

FIGS. 16(A)-16(C) are partial perspective views illustrating an assembly process utilized in the production of flash device 100D according to another embodiment of the present invention.

FIG. 16(A) depicts a first portion of the assembly process in which PCBA 120D is inserted into tubular housing portion 110D-1 such that a portion of plug connector 150D extends through front opening portion 114D-12, and then front cap portion 110D-2 is moved toward the front end of tubular housing portion 110D-1 by sliding plug connector 150D into front opening 114D-11. Front cap portion 110D-2 is then secured to tubular housing portion 110D-1 by way of snap-lock structures 119D. In alternative embodiments, front cap portion 110D-2 may be secured to tubular housing portion 110D-1 by another fastening method such as adhesive or ultrasonic welding. An advantage of the tubular housing arrangement is that the single-piece construction of tubular housing portion 110D-1 reliably sets the distance between upper housing wall 111D and lower housing wall 112D during the molding process, which may produce more reliably uniform product lines, and may simplify the assembly process.

FIG. 16(B) depicts a second portion of the assembly process in which swivel cover 160D is mounted onto housing 110D such that ring-shaped protrusions 166D and 167D are engaged in recessed ring-shaped grooves 116D and 117D, respectively, in the manner described above with reference to the generalized embodiment.

Figure 17:
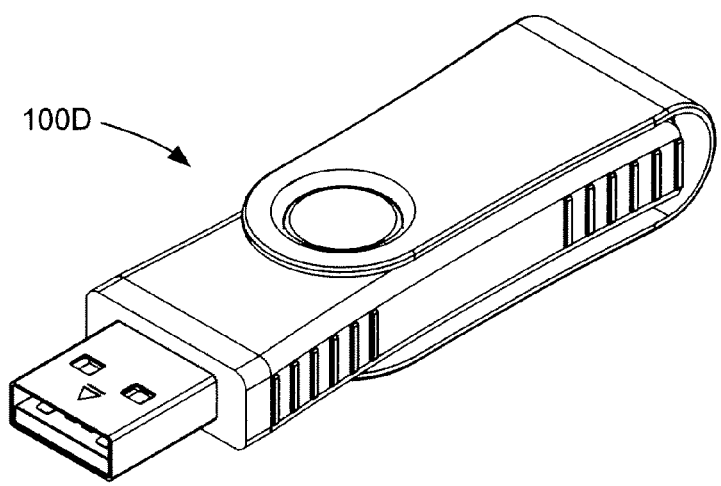
FIG. 17 is a top front perspective view showing the swivel-type flash device of FIG. 15 in an assembled state.

FIG. 16(C) depicts a third portion of the assembly process in which rivet caps 170D-1 and 170D-2 are attached to connect swivel cover 160D to housing 110D in the manner described above, thereby completing the assembly of flash device 100D, which is shown in FIG. 17 in the fully opened position.

Figure 18:
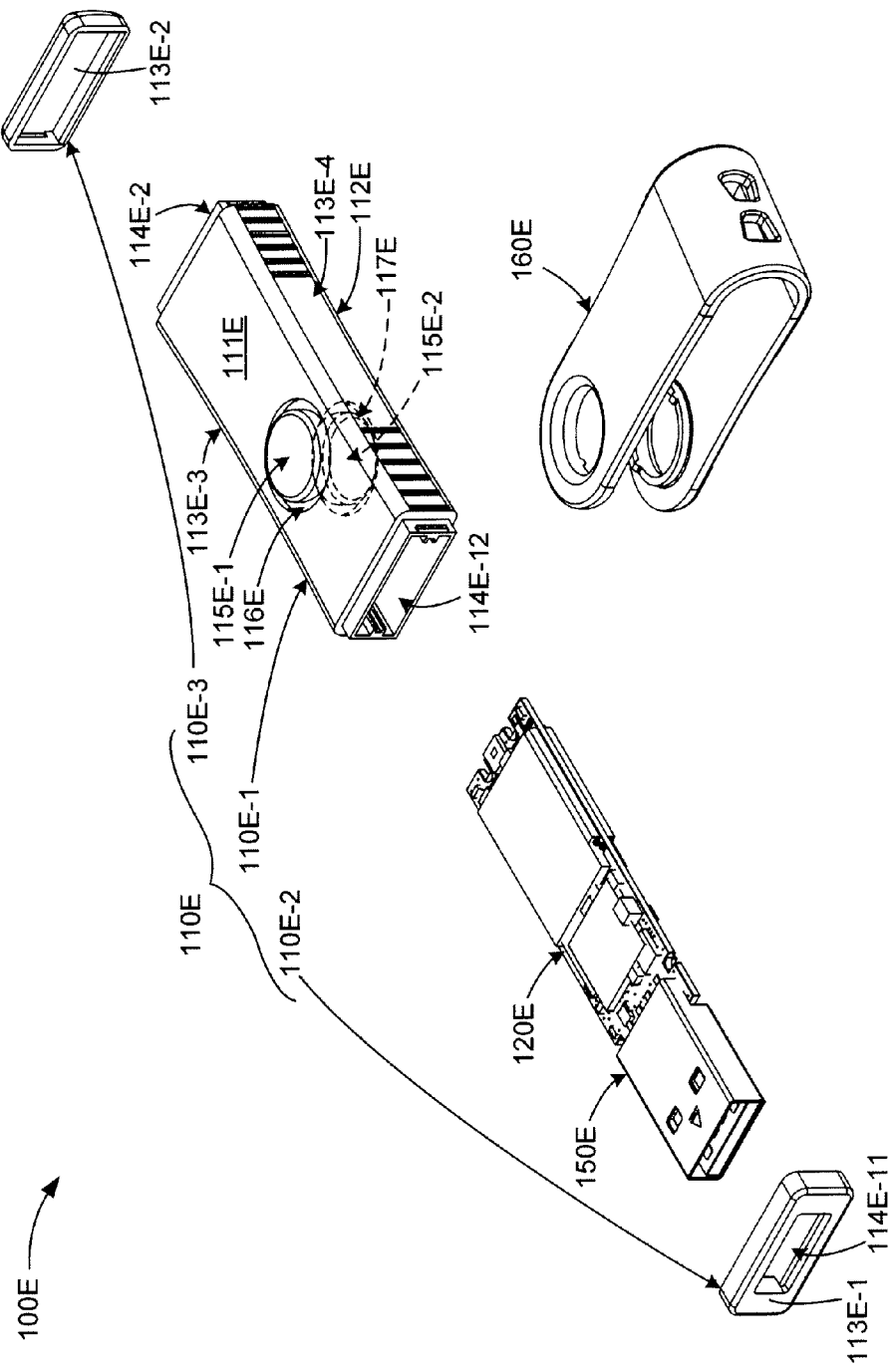
FIG. 18 is an exploded perspective view showing a swivel-type flash device according to a fifth specific embodiment of the present invention.

FIG. 18 is an exploded perspective view showing a swivel-type flash device 100E according to a fifth specific embodiment of the present invention. Similar to flash devices 100B and 100C, flash device 100E includes an MLC-type PCBA 120E, a housing 110E, and a swivel cover 160E.

Flash device 100E differs from the previously described embodiments in that housing 100E includes a housing 110E made up of a tubular housing portion 110E-1, a front end cap 110E-2 and a rear end cap 110E-2. Tubular housing portion 110E-1 is an integrally molded plastic structure including an upper wall 111E, a lower wall 112E, and side walls 113E-3 and 113E-4. Similar to the third specific embodiment (discussed above), upper wall 111E includes a recessed ring-shaped groove 116E surrounding an upper circular attachment structure 115E-1, and lower wall 112E includes a recessed ring-shaped groove 117E surrounding a lower circular attachment structure 115E-2. The front end of tubular housing portion 110E-1 defines a front opening 114E-12 and includes one or more snap-lock structures, and the rear end of tubular housing portion 110E-1 defines a rear opening 114E-22 and also includes one or more snap-lock structures. Front end cap 110E-2, which forms front wall 113E-1 of housing 110E when attached onto tubular housing portion 110E-1, defines front opening 114E-11 that is sized to fit tightly over plug connector 150E. Rear end cap 110E-3 forms rear wall 113E-2 of housing 110E when attached onto tubular housing portion 110E-1.

Figure 19:
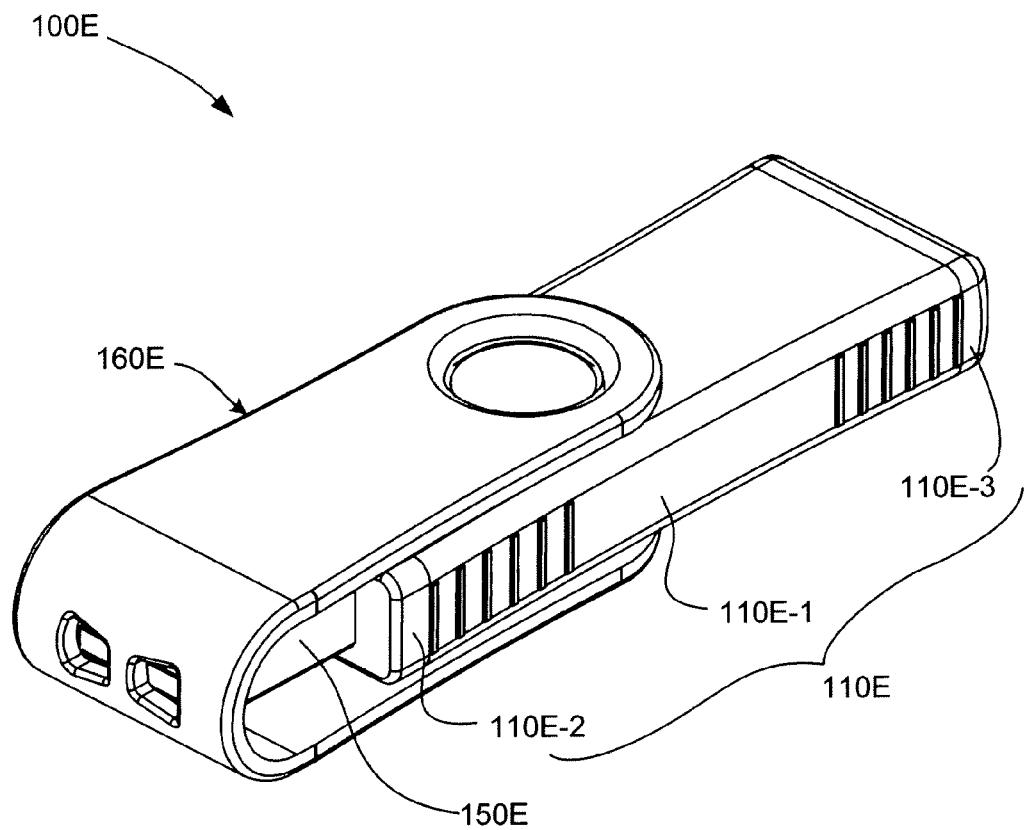
FIG. 19 is a top front perspective view showing the swivel-type flash device of FIG. 18 in an assembled state.

Assembly of flash device 100E is similar to that of flash device 100D (discussed above). FIG. 19 shows flash device 100E in a fully assembled state, wherein front end cap 110E-2 and rear end cap 110E-3 are attached to opposing ends of tubular housing portion 110E-1 to form housing 110E, and swivel cover 160E is shown in the fully closed state such that it substantially entirely covers plug connector 150E.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a USB plug connector has been shown and described, other types of plug connectors may also be used, such as those utilized by extended USB plug connector (USB 3.0 plug connector), Thunderbolt™ connector, Compact Flash (CF), PCI-Express, Integrated Drive Electronics (IDE), or Serial Advanced technology Attachment (SATA) technologies. In summary, the scope of the invention should not be restricted to the specific exemplary embodiments disclosed herein, and all modifications that are readily suggested to those of ordinary skill in the art should be included within the spirit and purview of this application and scope of the appended claims.

The invention claimed is:

1. A portable flash device comprising:

an elongated housing including an upper housing wall defining a first recessed ring-shaped groove, a lower housing wall defining a second recessed ring-shaped groove, and a peripheral wall that extends between outer edges of the upper and lower housing wall such that an enclosed chamber is defined between the upper housing wall, lower housing wall and peripheral wall;

at least one electronic device disposed in the enclosed chamber of the housing;

a plug connector fixedly connected to the housing and extending from a front wall portion of the peripheral wall, the plug connector being electronically connected to said at least one electronic device; and a C-shaped swivel cover including an upper cover wall and a lower cover wall that are integrally connected by an end wall, wherein the swivel cover is permanently rotatably connected to the housing by way of a first ring-shaped protrusion that extends perpendicular to the upper cover wall and is movably engaged in the first recessed ring-shaped groove, and by way of a second ring-shaped protrusion that extends perpendicular to the lower cover wall and is movably engaged in the second recessed ring-shaped groove, whereby the swivel cover is manually rotatable relative to the housing between a first position in which portions of the upper cover wall and the lower cover wall and the end wall substantially enclose the plug connector, and a second position in which the plug connector is operably exposed for insertion in a host system, wherein the end wall is spaced from a front edge of the plug connector by a first minimal offset distance that provides a clearance for rotation of the swivel cover, wherein the peripheral wall of the housing further includes a rear wall portion that is disposed opposite to the front wall portion, and wherein the first recessed ring-shaped groove and the second recessed ring-shaped groove are respectively located approximately midway between the rear wall portion and a front edge of the plug connector, whereby when the swivel cover is manually rotated 180° from the first position, the end wall is spaced from the rear wall portion by a second minimum offset distance that provides a clearance for rotation of the swivel cover and is substantially equal to the first minimal offset distance.

2. The flash device according to claim 1,
wherein the end wall comprises a substantially semi-cylindrical structure extending between the upper cover wall and the lower cover wall.

3. The flash device according to claim 1,
wherein the swivel cover further comprises at least one integrally connected first locking structure disposed on at least one of the first ring-shaped protrusion and the second ring-shaped protrusion, and
wherein the housing further comprises at least one integrally molded second locking structure disposed in at least one of the first ring-shaped groove and the second ring-shaped groove, and
wherein the swivel cover is mounted on the housing such that the first locking structure operably engages the second locking structure when the plug connector is in the first position such that a greater manual force is required to rotate the swivel cover out of the first position than to rotate the swivel cover between the first position and the second position.

4. The flash device according to claim 1,
wherein the swivel cover is mounted on the housing such that the first ring-shaped protrusion is biased into the first ring-shaped groove and the second ring-shaped protrusion is biased into the second ring-shaped groove,
wherein the swivel cover further comprises at least one integrally connected snap slot disposed on at least one of the first ring-shaped protrusion and the second ring-shaped protrusion, and
wherein the housing further comprises at least one integrally molded snap tab disposed in at least one of the first ring-shaped groove and the second ring-shaped groove, and
wherein the swivel cover is mounted on the housing such that the snap slot operably engages the snap tab when the plug connector is in the first position.

5. The flash device according to claim 1, wherein the swivel cover is attached to housing such that a maximum overall thickness of the flash device is equal to a perpendicular distance between the outermost surfaces of the upper cover wall and the lower cover wall.

6. The flash device according to claim 5,
wherein the upper cover wall defines a first circular hole surrounded by the first ring-shaped protuberance and the lower cover wall defines a second circular hole surrounded by the second ring-shaped protuberance, and
wherein the flash device further comprises:
a first rivet cap having a cap portion disposed inside the first circular hole and a base structure fixedly attached to the upper housing wall; and
a second rivet cap having a cap portion disposed inside the second circular hole and a base structure fixedly attached to the lower housing wall.

7. The flash device according to claim 6,
wherein the upper housing wall defines a first circular rivet opening surrounded by said first recessed ring-shaped groove, and the lower housing wall defines a second circular rivet opening surrounded by said second recessed ring-shaped groove,
wherein the first rivet cap comprises a plurality of first snap arms extending through the first circular rivet opening and being snap-coupled to the upper housing wall, and
wherein the second rivet cap comprises a plurality of second snap arms extending through the second circular rivet opening and being snap-coupled to the lower housing wall.

8. The flash device according to claim 6, further comprising a light source disposed inside the housing and positioned adjacent to at least one of the first and second rivet openings, and
wherein at least one of the first and second the rivet caps comprise a light permissive material.

9. The flash device according to claim 5,
wherein the upper cover wall defines a first circular hole surrounded by the first ring-shaped protuberance and the lower cover wall defines a second circular hole surrounded by the second ring-shaped protuberance, and
wherein the housing further comprises:
a first circular connection structure integrally molded on the upper housing wall extending into the first circular hole and terminating at a first disk-shaped surface, and
a second circular connection structure integrally molded on the lower housing wall and extending into the second circular hole and terminating at a second disk-shaped surface,
wherein a maximum thickness of said housing defined between said first and second disk-shaped surfaces of the first and second circular connection structures is equal to a thickness a thickness between the outermost surfaces of upper cover wall and lower cover wall.

10. The flash device according to claim 9, further comprising:
a light source disposed inside the housing and positioned between the plug connector and the first circular connection structure; and
a light pipe disposed in the upper housing wall adjacent to the light source.

11. The flash device according to claim 1, wherein the housing comprises an upper housing portion and a lower housing portion, that are connected together along a seam defined in the peripheral wall.

12. The flash device according to claim 1, wherein the housing comprises a tubular housing portion and at least one of a front cap portion fixedly attached to a front edge of the tubular housing portion and a rear cap portion fixedly attached to a rear edge of the tubular housing portion.

13. The flash device according to claim 1, wherein the plug connector comprises a Universal Serial Bus (USB) plug.

14. The flash device according to claim 1, wherein said at least one electronic device being one of a multi-level cell (MLC) package, a Chip-On-Board (COB) package, and a Slim Printed Circuit Board Assembly (Slim PCBA) package.

15. The flash device according to claim 1, wherein the end wall of the C-shaped swivel cover defines a pair of key-chain openings.

16. The flash device according to claim 1,
wherein the peripheral wall of the housing further comprises first and second side wall portions respectively extending between the front wall portion and the rear wall portion, and
wherein the flash device further comprises a plurality of protrusion stripes disposed on the first and second side wall portions.

* * * * *